United States Patent
Garcia et al.

(10) Patent No.: US 10,118,712 B2
(45) Date of Patent: Nov. 6, 2018

(54) ELECTRICAL CONDUCTOR PATHWAY SYSTEM AND METHOD OF MAKING THE SAME

(71) Applicant: The Boeing Company, Chicago, IL (US)

(72) Inventors: Victoria L. Garcia, Everett, WA (US); Mark J. Gardner, Snohomish, WA (US); Otis F. Layton, Bonney Lake, WA (US); Jeffrey Lynn Duce, Maple Valley, WA (US); Joseph A. Marshall, IV, Kent, WA (US)

(73) Assignee: The Boeing Company, Chicago, IL (US)

( * ) Notice: Subject to any disclaimer, the term of this patent is extended or adjusted under 35 U.S.C. 154(b) by 320 days.

(21) Appl. No.: 15/088,051

(22) Filed: Mar. 31, 2016

(65) Prior Publication Data
US 2016/0214735 A1    Jul. 28, 2016

Related U.S. Application Data

(63) Continuation-in-part of application No. 14/138,120, filed on Dec. 22, 2013, now Pat. No. 9,391,261.
(Continued)

(51) Int. Cl.
*B64D 45/02* (2006.01)
*H01L 41/113* (2006.01)
(Continued)

(52) U.S. Cl.
CPC ............. *B64D 45/02* (2013.01); *G01L 1/16* (2013.01); *G01M 5/0016* (2013.01);
(Continued)

(58) Field of Classification Search
CPC .... H05K 1/0224; H05K 1/0259; H05K 1/097; B64D 45/02; G01L 1/16; G01M 5/0083
See application file for complete search history.

(56) References Cited

U.S. PATENT DOCUMENTS 7,525,785 B2   4/2009   Rawlings
7,867,621 B2   1/2011   Rawlings et al.
(Continued)

FOREIGN PATENT DOCUMENTS

EP   0269775 A1   6/1988
EP   02947972 A1   11/2015

OTHER PUBLICATIONS

European Patent Office Extended European Search Report, dated Nov. 13, 2017, for counterpart application No. EP 16195602.4, Applicant The Boeing Company, 9 pages.

*Primary Examiner* — Timothy Thompson
*Assistant Examiner* — Amol Patel

(57) ABSTRACT

The disclosure provides in one embodiment an electrical conductor pathway system for diverting an electric charge. The electrical conductor pathway system includes a substrate having a first surface to be printed on and having one or more grounding points. The electrical conductor pathway system further includes a direct write conductive material pattern printed directly onto the first surface via a direct write printing process. The direct write conductive material pattern forms one or more electrical pathways interconnected with the one or more grounding points. The one or more electrical pathways interconnected with the one or more grounding points divert the electric charge from the first surface to the one or more grounding points.

20 Claims, 19 Drawing Sheets

Related U.S. Application Data which is a continuation of application No. 13/212,037, filed on Aug. 17, 2011, now Pat. No. 8,614,724.

(51) Int. Cl.

| | |
|---|---|
| *H01L 41/187* | (2006.01) |
| *H01L 41/317* | (2013.01) |
| *G01M 5/00* | (2006.01) |
| *G01L 1/16* | (2006.01) |
| *H05K 1/02* | (2006.01) |
| *H05K 1/09* | (2006.01) |

(52) U.S. Cl.
CPC ........ *G01M 5/0033* (2013.01); *G01M 5/0083* (2013.01); *H01L 41/1876* (2013.01); *H05K 1/0224* (2013.01); *H05K 1/0259* (2013.01); *H05K 1/097* (2013.01); *H01L 41/1132* (2013.01)

(56) References Cited

U.S. PATENT DOCUMENTS

| | | | |
|---|---|---|---|
| 8,206,823 B2 | 6/2012 | Schaaf et al. | |
| 8,257,830 B2 | 9/2012 | Bimanand et al. | |
| 8,715,824 B2 | 5/2014 | Rawlings et al. | |
| 8,886,388 B2 | 11/2014 | Moser et al. | |
| 2006/0051592 A1 | 3/2006 | Rawlings et al. | |
| 2006/0163744 A1* | 7/2006 | Vanheusden | B82Y 30/00 257/773 |
| 2007/0230085 A1* | 10/2007 | Le | B64D 45/02 361/212 |
| 2008/0142238 A1* | 6/2008 | Rawlings | B64D 45/02 174/2 |
| 2011/0033632 A1* | 2/2011 | Vance | H05K 3/125 427/472 |
| 2012/0197482 A1 | 8/2012 | Moser et al. | |
| 2013/0228365 A1 | 9/2013 | Uprety et al. | |
| 2015/0333250 A1 | 11/2015 | Duce et al. | |

* cited by examiner

ELECTRICAL CONDUCTOR PATHWAY SYSTEM AND METHOD OF MAKING THE SAME

CROSS REFERENCE TO RELATED APPLICATIONS

The present application is a continuation-in-part of and claims priority to application Ser. No. 14/138,120, filed on Dec. 22, 2013, titled "STRUCTURES WITH PZT NANO-PARTICLE INK BASED PIEZOELECTRIC SENSOR ASSEMBLY", which is a continuation of and claims priority to U.S. nonprovisional patent application Ser. No. 13/212,037, filed Aug. 17, 2011, now U.S. Pat. No. 8,614,724, issued Dec. 24, 2013, titled "METHOD AND SYSTEM OF FABRICATING PZT NANOPARTICLE INK BASED PIEZOELECTRIC SENSOR", which is related to U.S. nonprovisional patent application Ser. No. 13/211,554, filed on Aug. 17, 2011, now U.S. Pat. No. 9,005,465, issued Apr. 14, 2015, titled "METHODS FOR FORMING LEAD ZIRCONATE TITANATE NANOPARTICLES", which is also related to U.S. nonprovisional patent application Ser. No. 13/212,123, filed on Aug. 17, 2011, now U.S. Pat. No. 8,766,511, issued Jul. 1, 2014, titled "METHOD AND SYSTEM FOR DISTRIBUTED NETWORK OF NANOPARTICLE INK BASED PIEZOELECTRIC SENSORS FOR STRUCTURAL HEALTH MONITORING". The contents of application Ser. No. 14/138,120, application Ser. No. 13/212,037, application Ser. No. 13/211,544, and application Ser. No. 13/212,123 are all hereby incorporated by reference in their entireties.

BACKGROUND

1) Field of the Disclosure

The disclosure relates generally to systems and methods using conductive materials printed or deposited with direct write printing processes, and more particularly, to lightning protection systems and methods using conductive materials, such as nanoparticle ink, printed or deposited with direct write printing processes. The disclosure also relates generally to methods and systems of fabricating sensors, and more particularly, to methods and systems for fabricating nanoparticle piezoelectric sensors deposited onto a structure.

2) Description of Related Art

Composite materials are used in a wide variety of structures and component parts, including in the manufacture of air vehicles, such as aircraft, spacecraft, and rotorcraft, and in the manufacture of watercraft, automobiles, trucks, and other vehicles, due to their high strength-to-weight ratios, corrosion resistance, and other favorable properties. In particular, in aircraft construction, composite structures and component parts are used in increasing quantities to form the fuselage, wings, tail section, skin panels, and other component parts of the aircraft.

However, composite materials are less conductive than metallic materials, and composite structures and component parts may have difficulty dissipating electric charge or energy from a lightning strike or from P-static (precipitation static), as quickly or efficiently as metallic structures and component parts.

Known systems and methods have been developed to manage lightning strikes and static buildup, for example, P-static, on composite structures of air vehicles, such as aircraft. Several known systems and methods add metallic conductors or incorporate metal foil systems of various configurations into composite structures and component parts. The addition of such metallic conductors may include metallic diverter strips applied to composite structures and component parts. The incorporation of such metal foil systems may include the use of copper or aluminum foil in the form of metallic mesh embedded within composite structures and component parts. However, such known metallic diverter strips and embedded metallic mesh may have difficulty handling the fatigue of a flexible surface, such as a flight control surface of a wing of an aircraft, and may affect the structure of the composite material or component part they are applied to or embedded within.

In addition, known applique-based systems may be used to manage lightning strikes and static buildup for example, P-static, on composite structures of air vehicles, such as aircraft. Such known applique-based systems use alternate layers of dielectric and conductive materials applied as an applique over the composite structure surface and secured to the surface with an adhesive. However, such known appliques may not be installed or applied during manufacturing or during layup of the part, and may typically be installed or applied after manufacturing in a secondary operation. This may result in decreased producibility. Further, such known appliques typically include a continuous layer applied with an adhesive and may be difficult to repair or replace in situ.

Another difficulty with such known systems and methods of managing lightning strikes and static buildup is that they are not direct write processed, but may require manufacturing with a special layup process, which may increase the time and expense of manufacturing, or may require application in a less permanent, secondary operation after manufacturing.

Accordingly, there is a need in the art for an improved electrical conductor pathway system and method for managing electric charge, such as from lightning strikes and P-static, on the surface of composite structures and component parts, that provide advantages over known systems and methods.

Small sensors, such as microsensors, may be used in a variety of applications including in structural health monitoring (SHM) systems and methods to continuously monitor structures, such as composite or metal structures, and to measure material characteristics and stress and strain levels in order to assess performance, possible damage, and current state of the structures. Known SHM systems and methods may include the use of small, stiff, ceramic disk sensors integrated onto a polyimide substrate and connected to power and communication wiring. Such known sensors are typically manually bonded to a structure with an adhesive. Such manual installation may increase labor and installation costs and such adhesive may degrade over time and may result in the sensor disbonding from the structure. In addition, such known sensors may be made of rigid, planar, and/or brittle materials that may limit their usage, for example, usage on a curved or non-planar substrate surface may be difficult. Moreover, in a large array of such known sensors, the amount of power and communication wiring required may increase the complexity and the weight of the structure.

In addition, known sensor systems and methods, such as micro-electromechanical systems (MEMS) and methods, may include the use of depositing onto a substrate piezoelectric sensors, such as lead zirconate titanate (PZT) sensors, having nanoparticles. Known methods for making such MEMS may include molten salt synthesis of PZT powder for direct write inks. However, the applications of the PZT sensors fabricated with such known methods may be limited by the physical geometry of the PZT sensors. Such physical geometry limitations may result in inadequate sensing capacities or inadequate actuation responses. Further, the PZT sensors fabricated with such known methods may be unable to be applied or located in areas where their function may be important due to the PZT sensor fabrication method. For example, known molten salt synthesis methods may require processing at higher temperatures than certain application substrates can tolerate.

Further, such known MEMS systems and methods may also include the use of sensors having nanoparticles which have not been crystallized and which may be less efficient than nanoparticles which have been crystallized. Non-crystallized structures typically have greater disorganization resulting in decreased response sensitivity to strain and voltage, whereas crystallized structures typically have greater internal organization resulting in increased response sensitivity to strain and decreased necessity for energy to operate. In addition, the nanoparticles of the sensors may be too large for some known deposition processes and systems, such as a jetted atomized deposition (JAD) process, and such nanoparticles may require a high temperature sintering/crystallization process which may result in damage to temperature sensitive substrates or structures.

Accordingly, there is a need in the art for an improved method and system of fabricating PZT piezoelectric sensors having nanoparticles that may be used in structural health monitoring systems and methods for structures, where such improved method and system provide advantages over known methods and systems.

SUMMARY

Example implementations of this disclosure provide an improved electrical conductor pathway system and method. As discussed in the below detailed description, embodiments of the improved electrical conductor pathway system and method may provide significant advantages over known systems and methods for managing electric charge on a surface of a structure.

In an embodiment of the disclosure there is provided an electrical conductor pathway system for diverting an electric charge. The electrical conductor pathway system comprises a substrate having a first surface to be printed on and having one or more grounding points. The The direct write conductive material pattern forms one or more electrical pathways interconnected with the one or more grounding points. The one or more electrical pathways interconnected with the one or more grounding points divert the electric charge from the first surface to the one or more grounding points.

In another embodiment of the disclosure, there is provided an air vehicle. The air vehicle comprises an air vehicle structure having an electrical conductor pathway system.

The electrical conductor pathway system comprises a primed substrate having a primed surface to be printed on and having one or more grounding points. The electrical conductor pathway system further comprises a direct write conductive material pattern comprising a grid pattern printed directly onto the primed surface via a direct write printing process. The direct write conductive material pattern forms one or more electrical pathways interconnected with the one or more grounding points.

The electrical conductor pathway system further comprises a conductive coating applied over the direct write conductive material pattern. The electrical conductor pathway system further comprises a topcoat layer applied over the conductive coating. The one or more electrical pathways interconnected with the one or more grounding points divert an electric charge from a lightning strike or from precipitation static (P-static) on an exterior surface of the air vehicle structure to the one or more grounding points.

In another embodiment of the disclosure, there is provided a method of making an electrical conductor pathway system for diverting an electric charge on a structure. The method comprises the step of providing the structure having a surface to be printed on and having one or more grounding points. The method further comprises the step of printing via a direct write printing process, a direct write conductive material pattern onto the surface of the structure to form one or more electrical pathways. The method further comprises the step of interconnecting the one or more electrical pathways with the one or more grounding points to divert the electric charge from the surface to the one or more grounding points.

In addition, this need for a method and system of fabricating lead zirconate titanate (PZT) piezoelectric sensors having nanoparticles that may be used in structural health monitoring systems and methods for structures is satisfied. As discussed in the below detailed description, embodiments of the method and system may provide significant advantages over existing methods and systems.

In another embodiment of the disclosure, there is provided a method of fabricating a lead zirconate titanate (PZT) nanoparticle ink based piezoelectric sensor. The method comprises formulating a PZT nanoparticle ink. The method further comprises depositing the PZT nanoparticle ink onto a substrate via an ink deposition process to form a PZT nanoparticle ink based piezoelectric sensor.

In another embodiment of the disclosure, there is provided a method of fabricating a lead zirconate titanate (PZT) nanoparticle ink based piezoelectric sensor. The method comprises formulating a PZT nanoparticle ink comprising pre-crystallized PZT nanoparticles. The method further comprises suspending the PZT nanoparticle ink in a sol-gel based adhesion promoter. The method further comprises depositing the PZT nanoparticle ink onto a substrate via a direct write printing process to form a PZT nanoparticle ink based piezoelectric sensor.

In another embodiment of the disclosure, there is provided a system for fabricating a lead zirconate titanate (PZT) nanoparticle ink based piezoelectric sensor. The system comprises a formulated PZT nanoparticle ink. The system further comprises an ink deposition apparatus depositing the PZT nanoparticle ink onto a substrate to form a PZT nanoparticle ink based piezoelectric sensor. The structure may have a non-curved or planar surface, a curved or non-planar surface, or a combination of a non-curved or planar surface and a curved or non-planar surface. The PZT nanoparticle ink based piezoelectric sensor may be deposited onto a surface of the structure with one or more layers of insulation, coatings, or paint in between a body of the structure and the PZT nanoparticle ink based piezoelectric sensor.

In another embodiment of the disclosure, there is provided a structure comprising a substrate and a direct write deposited lead zirconate titanate (PZT) nanoparticle ink based piezoelectric sensor assembly deposited on the substrate. The PZT nanoparticle ink based piezoelectric sensor assembly comprises a PZT nanoparticle ink based piezoelectric sensor comprising a PZT nanoparticle ink deposited onto the substrate via an ink deposition direct write printing process. The PZT nanoparticle ink does not require a high temperature sintering/crystallization process once deposited. The PZT nanoparticle ink based piezoelectric sensor assembly further comprises a power and communication wire assembly coupled to the PZT nanoparticle ink based piezoelectric sensor. The power and communication wire assembly comprises a conductive ink deposited onto the substrate via the ink deposition direct write printing process.

In another embodiment of the disclosure, there is provided a composite structure comprising a composite substrate and a direct write deposited lead zirconate titanate (PZT) nanoparticle ink based piezoelectric sensor assembly deposited on the composite substrate. The PZT nanoparticle ink based piezoelectric sensor assembly comprises a PZT nanoparticle ink based piezoelectric sensor comprising a PZT nanoparticle ink deposited onto the composite substrate via an ink deposition direct write printing process. The PZT nanoparticle ink does not require a high temperature sintering/crystallization process once deposited. The PZT nanoparticle ink based piezoelectric sensor assembly further comprises a power and communication wire assembly coupled to the PZT nanoparticle ink based piezoelectric sensor. The power and communication wire assembly comprises a conductive ink deposited onto the composite substrate via the ink deposition direct write printing process.

In another embodiment of the disclosure, there is provided a metallic structure comprising a metallic substrate and a direct write deposited lead zirconate titanate (PZT) nanoparticle ink based piezoelectric sensor assembly deposited on the metallic substrate. The PZT nanoparticle ink based piezoelectric sensor assembly comprises a PZT nanoparticle ink based piezoelectric sensor comprising a PZT nanoparticle ink deposited onto the metallic substrate via an ink deposition direct write printing process. The PZT nanoparticle ink does not require a high temperature sintering/crystallization process once deposited. The PZT nanoparticle ink based piezoelectric sensor assembly further comprises a power and communication wire assembly coupled to the PZT nanoparticle ink based piezoelectric sensor. The power and communication wire assembly comprises a conductive ink deposited onto the metallic substrate via the ink deposition direct write printing process. The PZT nanoparticle ink based piezoelectric sensor assembly further comprises an insulation layer deposited between the metallic substrate and the PZT nanoparticle ink based piezoelectric sensor of the direct write deposited lead zirconate titanate (PZT) nanoparticle ink based piezoelectric sensor assembly.

The features, functions, and advantages that have been discussed can be achieved independently in various embodiments of the disclosure or may be combined in yet other embodiments further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary embodiments, but which are not necessarily drawn to scale, wherein.

DETAILED DESCRIPTION

Disclosed embodiments will now be described more fully hereinafter with reference to the accompanying drawings, in which some, but not all of the disclosed embodiments are shown. Indeed, several different embodiments may be provided and should not be construed as limited to the embodiments set forth herein. Rather, these embodiments are provided so that this disclosure will be thorough and complete and will fully convey the scope of the disclosure to those skilled in the art. The following detailed description is of the best currently contemplated modes of carrying out the disclosure. The description is not to be taken in a limiting sense, but is made merely for the purpose of illustrating the general principles of the disclosure, since the scope of the disclosure is best defined by the appended claims.

Figure 1A:
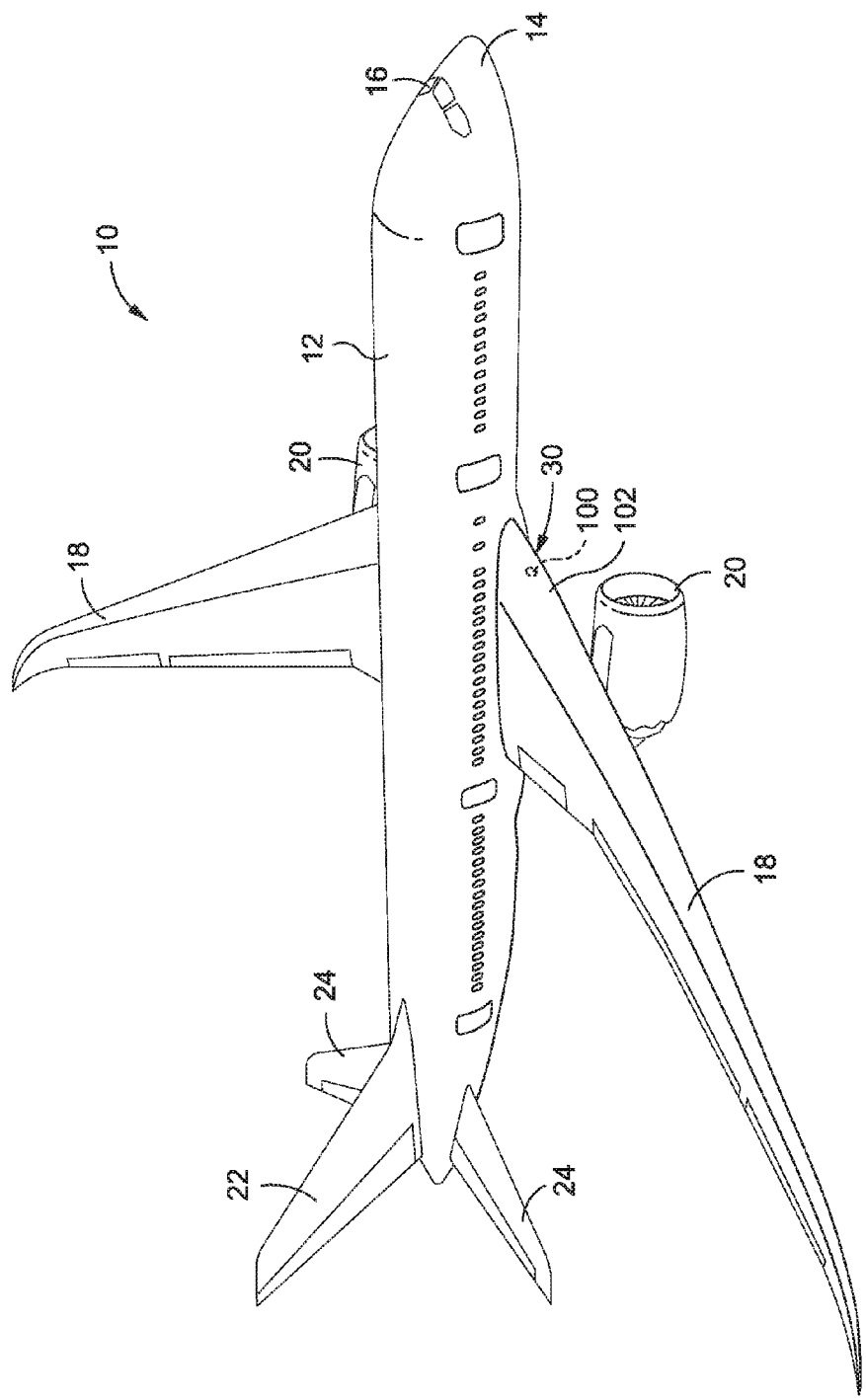
FIG. 1A is an illustration of a perspective view of an exemplary aircraft for which one of the embodiments of the system and method of the disclosure may be used.

Now referring to the Figures, FIG. 1A is an illustration of a perspective view of an exemplary prior art aircraft 10 for which one of the embodiments of a system 100 (see FIG. 5), a method 200 (see FIG. 8), or a method 250 (see FIG. 9), for fabricating a lead zirconate titanate (PZT) nanoparticle ink based piezoelectric sensor 110 (see FIG. 2) for a structure 30, such as composite structure 102 (see FIG. 1A) or a metallic structure 132 (see FIG. 3), may be used. As used herein, the term "PZT" means lead zirconate titanate—a piezoelectric, ferroelectric, ceramic material composed of the chemical elements lead and zirconium and the chemical compound titanate which may be combined under high temperatures. PZT exhibits favorable piezoelectric properties. As used herein, the term "piezoelectric" in relation to PZT means that PZT develops a voltage or potential difference across two of its faces when deformed, which is advantageous for sensor applications, or it physically changes shape when an external electric field is applied, which is advantageous for actuator applications. For purposes of this application, the term "ferroelectric" in relation to PZT means PZT has a spontaneous electric polarization or electric dipole which can be reversed in the presence of an electric field.

The aircraft 10 comprises a fuselage 12, a nose 14, a cockpit 16, wings 18 operatively coupled to the fuselage 12, one or more propulsion units 20, a tail vertical stabilizer 22, and one or more tail horizontal stabilizers 24. Although the aircraft 10 shown in FIG. 1A is generally representative of a commercial passenger aircraft, the system 100 and methods 200, 250 disclosed herein may also be employed in other types of aircraft. More specifically, the teachings of the disclosed embodiments may be applied to other passenger aircraft, cargo aircraft, military aircraft, rotorcraft, and other types of aircraft or aerial vehicles, as well as aerospace vehicles such as satellites, space launch vehicles, rockets, and other types of aerospace vehicles. It may also be appreciated that embodiments of systems, methods and apparatuses in accordance with the disclosure may be utilized in other vehicles, such as boats and other watercraft, trains, automobiles, trucks, buses, and other types of vehicles. It may also be appreciated that embodiments of systems, methods and apparatuses in accordance with the disclosure may be utilized in architectural structures, turbine blades, medical devices, electronic actuation equipment, consumer electronic devices, vibratory equipment, passive and active dampers, or other suitable structures.

Figure 1B:
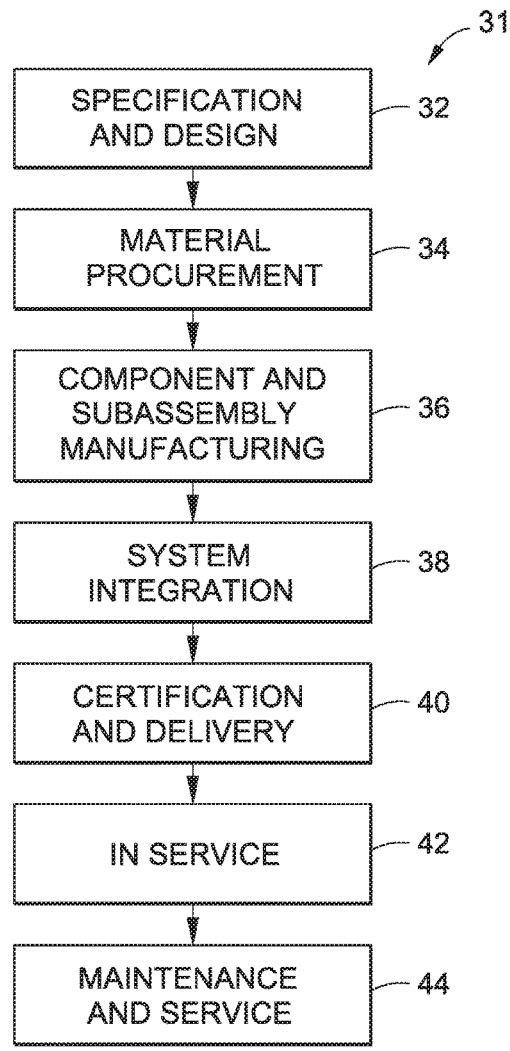
FIG. 1B is an illustration of a flow diagram of an embodiment of an aircraft manufacturing and service method.
Figure 1C:
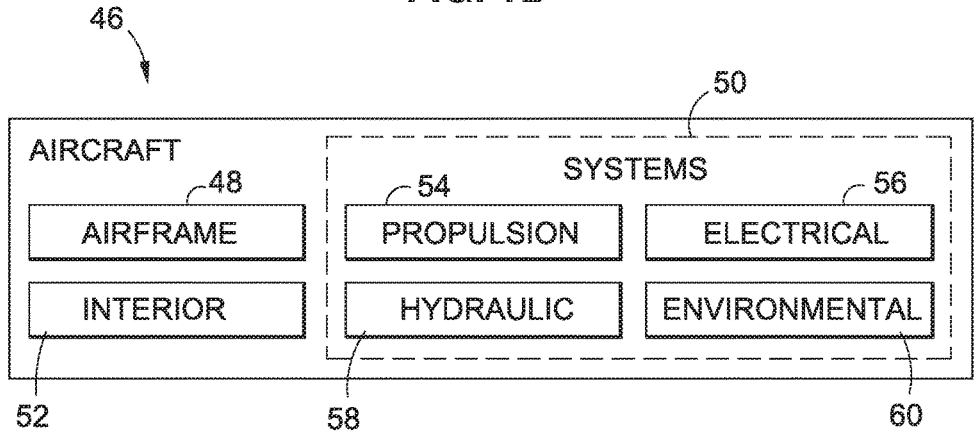
FIG. 1C is an illustration of a functional block diagram of an embodiment of an aircraft.

Referring now to FIGS. 1B and 1C, FIG. 1B is an illustration of a flow diagram of an embodiment of an aircraft manufacturing and service method 31. FIG. 1C is an illustration of a functional block diagram of an embodiment of an aircraft 46. Referring to FIGS. 1B-1C, embodiments of the disclosure may be described in the context of the aircraft manufacturing and service method 31, as shown in FIG. 1B, and the aircraft 46, as shown in FIG. 1C. During pre-production, the exemplary aircraft manufacturing and service method 31 (see FIG. 1B) may include specification and design 32 (see FIG. 1B) of the aircraft 46 (see FIG. 1C) and material procurement 34 (see FIG. 1B). During manufacturing, component and subassembly manufacturing 36 (see FIG. 1B) and system integration 38 (see FIG. 1B) of the aircraft 46 (see FIG. 1C) takes place. Thereafter, the aircraft 46 (see FIG. 1C) may go through certification and delivery 40 (see FIG. 1B) in order to be placed in service 42 (see FIG. 1B). While in service 42 (see FIG. 1B) by a customer, the aircraft 46 (see FIG. 1C) may be scheduled for routine maintenance and service 44 (see FIG. 1B), which may also include modification, reconfiguration, refurbishment, and other suitable services.

Each of the processes of the aircraft manufacturing and service method 31 (see FIG. 1B) may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may include an airline, leasing company, military entity, service organization, and other suitable operators.

As shown in FIG. 1C, the aircraft 46 produced by the exemplary aircraft manufacturing and service method 31 (see FIG. 1B) may include an airframe 48 with a plurality of systems 50 and an interior 52. As further shown in FIG. 1C, examples of the systems 50 may include one or more of a propulsion system 54, an electrical system 56, a hydraulic system 58, and an environmental system 60. Any number of other systems may be included. Although an aerospace example is shown, the principles of the disclosure may be applied to other industries, such as the automotive industry.

Methods and systems embodied herein may be employed during any one or more of the stages of the aircraft manufacturing and service method 31 (see FIG. 1B). For example, components or subassemblies corresponding to component and subassembly manufacturing 36 (see FIG. 1B) may be fabricated or manufactured in a manner similar to components or subassemblies produced while the aircraft 46 (see FIG. 1C) is in service 42 (see FIG. 1B). Also, one or more apparatus embodiments, method embodiments, or a combination thereof, may be utilized during component and subassembly manufacturing 36 (see FIG. 1B) and system integration 38 (see FIG. 1B), for example, by substantially expediting assembly of or reducing the cost of the aircraft 46 (see FIG. 1C). Similarly, one or more of apparatus embodiments, method embodiments, or a combination thereof, may be utilized while the aircraft 46 (see FIG. 1C) is in service 42 (see FIG. 1B), for example and without limitation, to maintenance and service 44 (see FIG. 1B).

Figure 5:
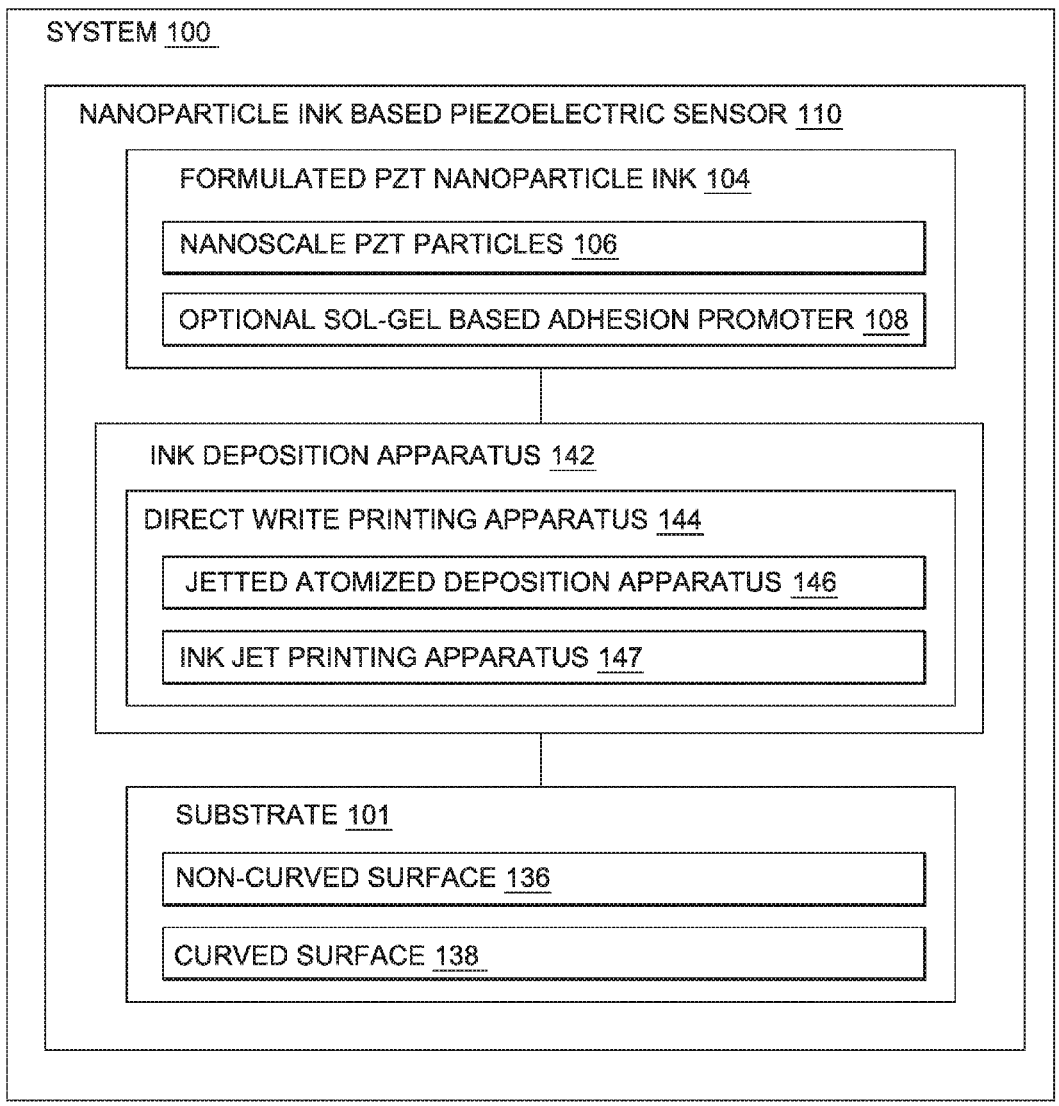
FIG. 5 is an illustration of a block diagram of one of the embodiments of a system for fabricating a PZT nanoparticle ink based piezoelectric sensor of the disclosure.

In an embodiment of the disclosure, there is provided a system 100 for fabricating the lead zirconate titanate (PZT) nanoparticle ink based piezoelectric sensor 110. FIG. 5 is an illustration of a block diagram of one of the embodiments of the system 100 for fabricating the PZT nanoparticle ink based piezoelectric sensor 110 (see also FIG. 2) of the disclosure. As shown in FIG. 5, the system 100 for fabricating the PZT nanoparticle ink based piezoelectric sensor 110 comprises a formulated lead zirconate titanate (PZT) nanoparticle ink 104. The PZT nanoparticle ink 104 comprises nanoscale PZT ink particles or nanoparticles 106. Preferably, the nanoscale PZT ink nanoparticles are pre-crystallized. The PZT nanoparticle ink 104 preferably has a nanoscale PZT particle size in a range of from about 20 nanometers to about 1 micron. The nanoscale PZT ink particles size allows for the PZT nanoparticle ink 104 to be deposited using a wide range of ink deposition processes, apparatuses, and systems, and in particular, allows for the PZT nanoparticle ink 104 to be deposited using a jetted atomized deposition process 126 (see FIGS. 6A and 10) system and a jetted atomized deposition apparatus 146 (see FIGS. 6A and 10). The PZT nanoparticle ink based piezoelectric sensor 110 may have a thickness in a range of from about 1 micron to about 500 microns. The thickness of the PZT nanoparticle ink based piezoelectric sensor 110 may be measured in terms of a factor of nanoparticle size of the PZT nanoparticles and the thickness of conductive electrodes 114, 118 (see FIG. 2). Thickness of the PZT nanoparticle ink based piezoelectric sensor 110 may also depend on the size of the PZT nanoparticle ink based piezoelectric sensor 110, as a proper aspect ratio may increase the sensitivity of the PZT nanoparticle ink based piezoelectric sensor 110.

The PZT nanoparticle ink 104 may further comprise a sol-gel based adhesion promoter 108 (see FIG. 5) for promoting adhesion of the PZT nanoparticle ink 104 to a substrate 101. Alternatively, the PZT nanoparticle ink 104 may further comprise a polymer based adhesion promoter such as an epoxy or another suitable polymer based adhesion promoter. The nanoscale PZT ink nanoparticles 106 may be suspended in a silica sol-gel and then deposited using an ink deposition process 122 such as a direct write printing process 124. The silica sol-gel in the PZT nanoparticle ink formulation enables the PZT nanoparticle ink 104 to bond to a wider variety of substrates than certain known adhesion promoters. The PZT nanoparticle ink based piezoelectric sensor 110 preferably has modalities based on ultrasonic wave propagation and electromechanical impedance.

The formulated lead zirconate titanate (PZT) nanoparticle ink 104 may be formulated by methods disclosed in contemporaneously filed U.S. nonprovisional patent application Ser. No. 13/211,554, titled "METHODS FOR FORMING LEAD ZIRCONATE TITANATE NANOPARTICLES", filed on Aug. 17, 2011, which is hereby incorporated by reference in its entirety.

In particular, in such disclosure, methods for forming lead zirconate titanate (PZT) nanoparticles are provided. The PZT nanoparticles are formed from a precursor solution—comprising a source of lead, a source of titanium, a source of zirconium, and a mineraliser—that undergoes a hydrothermal process according to the following reaction ("the hydrothermal process"):

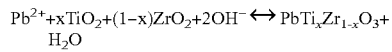

$$Pb^{2+} + xTiO_2 + (1-x)ZrO_2 + 2OH^- \leftrightarrow PbTi_xZr_{1-x}O_3 + H_2O$$

In the provided methods, the properties of the formed PZT nanoparticles are dictated at least by the mineraliser concentration, processing time, heating rate, and cooling rate.

In one aspect, a method is provided for forming a plurality of PZT nanoparticles (also referred to herein as "nanocrystals"). In one embodiment, the method includes the steps of: (a) providing an aqueous precursor solution comprising a mineraliser solution, a source of titanium, a source of zirconium, and a source of lead; and (b) heating the precursor solution to produce PZT nanoparticles, wherein heating the precursor solution comprises a first heating schedule that includes at least the sequential steps of: (i) heating the precursor solution at a first rate to a first temperature, wherein said first rate is between about 1° C./min (degrees Celsius per minute) and about 30° C./min, and wherein said first temperature is between about 120° C. and about 350° C.; (ii) holding for a first hold time at the first temperature, wherein said first hold time is between about 5 to about 300 minutes; and (iii) cooling at a second rate to provide a nanoparticle PZT solution comprising a suspended plurality of perovskite PZT nanoparticles having a smallest dimension of between about 20 nm (nanometer) and about 1000 nm, wherein said second rate is between about 1° C./min and about 30° C./min.

Precursor Solution.

The precursor solution is defined by reactants that are processed to form PZT nanoparticles. Specifically, the precursor solution includes at least a source of titanium, a source of zirconium, a source of lead, and a mineraliser. The precursor solution optionally includes additional solvents or stabilizers, as will be discussed in more detail below.

The components of the precursor solution may all be combined simultaneously in a single reaction vessel, or may be combined stepwise, depending on the character of the components of the precursor solution and a potential need to minimize interaction between the components of the precursor prior to hydrothermal reaction to produce PZT nanoparticles. For example, the source of titanium and the source of zinc may be combined to form a precursor gel, which is then combined with a source of lead in aqueous form and the mineraliser to provide the precursor solution. Such an approach allows for maximum control over the relative molar amounts of each of the reactants (i.e., the sources of titanium, zirconium, and lead).

The sources of lead, titanium, and zirconium are present in the precursor solution in molar amounts sufficient to obtain PZT nanoparticles having the formula $Pb_xZi_yTi_zO_3$, wherein x is between 0.8 and 2, wherein y is between 0.4 and 0.6, and wherein y plus z equals 1. For example, a common formula for perovskite PZT nanoparticles is $Pb(Zr_{0.52}Ti_{0.48})O_3$. However, it will be appreciated by those of skill in the art that the relative amounts of lead, zirconium, and titanium can be modified within the provided ranges to produce the desired characteristics of PZT nanoparticles.

The source of titanium in the precursor solution can be any titanium-containing compound that allows for the formation of PZT particles according to the method provided herein. In one embodiment, the source of titanium is $Ti[OCH(CH_3)_2]_4$. Additional sources of titanium may comprise $TiO_2$, $TiO_2*nH_2O$, $Ti(OC_4H_9)$, $Ti(NO_3)_2$, $TiCl_3$, $TiCl_4$.

The source of zirconium in the precursor solution can be any zirconium-containing compound that allows for the formation of PZT particles according to the method provided herein. In one embodiment, the source of zirconium is $Zr[O(CH_2)_2CH_3]_4$. Additional sources of zirconium may comprise $Zr(NO_3)_4*5H_2O$, $ZrOCl_2*8H_2O$, $ZrO_2*nH_2O$, $ZrO_2$.

The source of lead in the precursor solution can be any lead-containing compound that allows for the formation of PZT particles according to the method provided herein. In one embodiment, the source of lead is $Pb(CH_3COOH)_2$. Additional sources of lead may comprise $Pb(NO_3)_2$, $Pb(OH)_2$, $PbO$, $Pb_2O_3$, $PbO_2$.

In certain embodiments, excess lead is added to the precursor solution. As used herein, the term "excess lead" refers to a ratio amount greater than one for the source of lead. Excess lead is a means for exerting further control over the characteristics of the PZT nanoparticles. Typically, the excess lead is achieved in the precursor solution by adding an excess amount of the same source of lead as described above. For example, if the source of lead is lead acetate trihydrate, any amount of lead acetate trihydrate added to the precursor solution that results in the ratio of the lead acetate trihydrate to be greater than one compared to the source of zirconium and the source of titanium will be considered an excess amount of lead. In certain embodiments, the excess amount of lead comes from a second, different, source of lead.

Excess lead does not alter the chemical composition of the PZT nanoparticles, but instead modifies the hydrothermal reaction conditions to produce several desirable effects on the formed PZT nanoparticles. While the excess lead does not alter the fundamental crystal structure of the PZT nanoparticles, it improves morphology, reduces amorphous byproducts, and reduces the degree of agglomeration between particles.

One less desirable side effect of excess lead is that it also leads to the formation of a lead oxide compound that is an impurity. However, the lead oxide impurity can be removed by washing the formed PZT nanoparticles with an appropriate solvent (e.g., diluted acetic acid).

The mineraliser in the precursor solution facilitates the formation of PZT during the hydrothermal process. The mineraliser acts as a source of hydroxide ions to facilitate the hydrothermal synthesis of PZT. Representative mineralisers include KOH, NaOH, LiOH, $NH_4OH$, and combinations thereof. The concentration of the mineraliser, in a mineraliser solution prior to adding to the other components of the precursor solution, is from about 0.2 M to about 15 M if the mineraliser is liquid such as NaOH. If the mineraliser is solid, such as KOH, DI water is first added into the Zr, Ti, Pb mixture and then the solid mineraliser is added. The optimal mineraliser concentration depends on the conditions of the hydrothermal process, as is known to those of skill in the art.

The concentration of the mineraliser affects the size of PZT nanoparticles produced. For example, similar PZT nanoparticles formed using 5 M and 10 M KOH mineraliser have similar morphology, but 5 M mineraliser results in smaller nanoparticles than those formed with 10 M mineraliser, if all other processing conditions are the same.

In certain embodiments, a stabilizer is added to the precursor to prevent gelation and/or precipitation of certain components of the precursor prior to the hydrothermal process. That is, stabilizers may be required to maintain all of the necessary components of the precursor in solution prior to the hydrothermal process. For example, in one embodiment, acetylacetone ("AcAc") is added to the source of titanium (e.g., titanium isopropoxide) to prevent gelation and precipitation prior to reaction to form PZT. In another embodiment, propoxide is added to the source of titanium.

The precursor solution is typically aqueous, although it will be appreciated that any other solvent capable of solvating the components of the precursor solution and facilitating the formation of PZT nanoparticles can also be used. Alternatives to water may comprise aqueous solution, mixture of water and organic solvent, or weak organic acid, for example, ethylenediamine, $CH_2Cl_2$, ammonium salt, acetic acid or another suitable alternative.

In an exemplary embodiment, the precursor solution comprises KOH as the mineraliser solution, titanium isopropoxide as the source of titanium, zirconium n-propoxide as the source of zirconium, lead acetate trihydrate as the source of lead, acetylacetone as a stabilizer, and water. The lead acetate trihydrate, zirconium n-propoxide, and titanium isopropoxide are present in the precursor in a weight ratio of from about 1 to about 2 parts lead acetate trihydrate, from about 0.5 to about 1 parts zirconium n-propoxide, and from about 0.8 to about 1.6 parts titanium isopropoxide. The KOH mineraliser solution is from about 0.2 to about 15 M.

Heating Schedule.

PZT nanoparticles are formed through hydrothermal processing of the precursor solution. The hydrothermal process includes a heating schedule comprising a heating ramp to a first temperature, a hold at the first temperature, and a cooling ramp to room temperature.

The heating schedule is performed under pressure greater than 1 atm (atmosphere). Accordingly, the precursor solution is contained within an apparatus configured to both heat and pressurize. In certain embodiments, the pressure applied during the heating schedule is from about 1 atm to about 20 atm. In an exemplary embodiment, the precursor solution is contained within an autoclave and autogenous pressure builds in the autoclave over the course of the heating schedule. Alternatively, a constant pressure can be provided by a pump or other apparatus known to those of skill in the art.

In one embodiment, heating the precursor solution to produce PZT nanoparticles includes at least the sequential steps of: (i) heating the precursor solution at a first rate to a first temperature, wherein said first rate is between about 1° C./min (degrees Celsius per minute) and about 30° C./min, and wherein said first temperature is between about 120° C. and about 350° C.; (ii) holding for a first hold time at the first temperature, wherein said first hold time is between about 5 minutes to about 300 minutes; and, (iii) cooling at a second rate to provide a nanoparticle PZT solution comprising a suspended plurality of perovskite PZT nanoparticles having a smallest dimension of between about 20 nm (nanometers) and about 1000 nm, wherein said second rate is between about 1° C./min and about 30° C./min.

The heating ramp rate ("first rate") is used to raise the temperature of the precursor solution from about room temperature ($T_{RT}$) to the maximum hydrothermal processing temperature ($T_{max}$). The first rate is from about 1° C./min and about 30° C./min.

The processing temperature ("first temperature"; $T_{max}$) is between about 120° C. (Celsius) and about 350° C. In certain embodiments, the first temperature is 200° C. or less. While the heating schedule is primarily described herein as including a single first temperature, to which the solution is heated, it will be appreciated that the disclosed method contemplates variations in the first temperature that may arise from the hydrothermal reaction or inaccuracies in the heating equipment. Furthermore, the heating step of the heating schedule may include second, third, or further, temperatures to which the heated precursor solution is subjected. The second, third, or further temperatures may be higher or lower than the first temperature, as required to produce the desired PZT nanoparticles.

The first rate is particularly important to control the size of the PZT nanoparticles produced. In this regard, as the temperature of the precursor solution heats from $T_{RT}$ to $T_{max}$, there is an intermediate temperature, $T_{nuc}$, at which PZT crystals begin to nucleate ("Nucleation Zone"). Optimal PZT crystal growth occurs at $T_{max}$, and any crystals nucleated at a temperature lower than $T_{max}$ will likely grow larger with bigger aggregates and/or higher degree of agglomeration than PZT crystals nucleated at $T_{max}$.

A slow ramp rate results in a longer amount of time that the precursor solution spends between $T_{nuc}$ and $T_{max}$. Accordingly, a slow ramp rate results in more PZT crystal nucleation at temperatures below $T_{max}$, resulting in inconsistent PZT crystal size and crystal structure. As used herein, the term "slow ramp rate" refers to a ramp rate of below 1° C./min.

Conversely, a relatively fast ramp rate results in homogeneous PZT crystal nucleation by passing the precursor solution quickly through the temperature range between $T_{nuc}$ and $T_{max}$. As used herein, the term "fast ramp rate" refers to a ramp rate of 10° C./min or greater. In certain embodiments, the high ramp rate is a ramp rate of 20° C./min or greater.

As a result of the nucleation dynamics described above, the higher the ramp rate, the smaller the PZT particles generated. While the heating ramp rate affects the size and number of PZT crystals, it does not affect the crystal structure. Similarly, the cooling rate does not affect the crystal structure.

The "hold" step of the heating schedule allows the PZT crystals time to form and grow. The hold step is between about 5 minutes and about 300 minutes at the first temperature. Typically, a longer hold time results in larger crystals. Holding time is preferably to allow the crystals to grow. If the holding time is too short, the end product may not have PZT composition.

After the hold step, the heating schedule proceeds to a "cooling" step. The cooling rate reduces the temperature from the maximum processing temperature to room temperature at a "second rate." The range of the cooling rate is from about 1° C./min to about 30° C./min. The cooling rate impacts several aspects of the PZT nanoparticles. The cooling rate partially determines the morphology and size of the formed PZT nanoparticles. A relatively fast cooling rate, for example, a cooling rate of greater than 20° C. per minute, results in PZT nanoparticles in the range of 100 nm to 500 nm and a distinct cubic shape.

Additionally, a relatively fast cooling rate results in PZT nanoparticles that are physically bonded, as opposed to chemically bonded. Physically bonded PZT nanoparticles are preferable to those that are chemically bonded because separation of physically bonded nanoparticles is accomplished more readily than the separation of chemically bonded nanoparticles (e.g., by mechanical agitation). Finally, a faster cooling rate minimizes the presence of $PbTiO_3$ phase in the final product. This is desirable because $PbTiO_3$ not only is an impurity that must be removed to obtain pure PZT nanoparticles, but forming $PbTiO_3$ also reduces the yield of the PZT-formation reaction by consuming lead and titanium in a form other than PZT.

In certain embodiments, the second rate is sufficiently large that PZT particles are formed that are non-perovskite forms of PZT. In this regard, in certain embodiments, the method further comprises a step of treating the nanoparticle PZT solution to eliminate the non-perovskite forms of PZT. Such a treatment may include chemically-assisted dissolution, wet etching, acid washing, base washing, and combinations thereof. Any method that selectively eliminates (e.g., dissolves) the non-perovskite PZT can be used. For example, a dilute acetic acid wash can be used to eliminate the $PbTiO_3$ non-perovskite component of the PZT hydrothermal synthesis.

Alternatively, instead of eliminating the non-perovskite PZT particles, in certain embodiments, the method further includes a step of separating the perovskite PZT nanoparticles from the non-perovskite forms of PZT in the nanoparticle PZT solution. The end suspension is washed with DI water, diluted acid, or ethanol to remove the non-perovskite forms.

In certain embodiments, the second rate is sufficiently large that the nanoparticle PZT solution becomes supersaturated. Nucleation and crystal growth is allowed when the solution is supersaturated and they stop when the concentration reaches to an equilibrium. For all temperatures, there is an equilibrium concentration responses to it. Therefore, when the second rate is slow, the solution can be supersaturated multiple times and the crystal can have a greater opportunity to grow bigger. For a fast second rate, the initial concentration can be way above equilibrium and the high concentration may promote second nucleation to occur along with crystal growth. Nucleation rate is high when the concentration is high, so both nucleation and growth are rapid. Because of that, most likely the secondary nucleation and growth will not form stable crystals or create amorphous, which can be removed.

The route to forming the smallest and highest quality PZT nanoparticles is achieved using the shortest possible processing time for the hydrothermal processing, which includes using the highest heating ramp rate, the fastest cooling ramp rate, and a "medium" mineraliser concentration, since the required processing time will be different if the mineraliser concentration is changed. For example, if 5M mineraliser is used, the processing time can be as short as one (1) hour but for 2M mineraliser, the required processing time is three (3) hours. If the mineraliser concentration is lower at 0.4M, no PZT will be formed regardless of the processing time.

After the cooling step, a PZT nanoparticle solution is obtained. The PZT nanoparticle solution contains a plurality of PZT nanoparticles suspended in water. The PZT nanoparticle solution can be filtered or otherwise manipulated to isolate the PZT nanoparticles. Depending on the efficiency of the hydrothermal process, the solution may also contain $PbTiO_3$, $PbZrO_3$, $PbO$, $TiO_2$, $ZrO_2$, KOH or other potential impurities. Washing the solution with acetic acid is one method for removing PbO. Excess lead samples may be washed with acetic acid.

Figure 10:
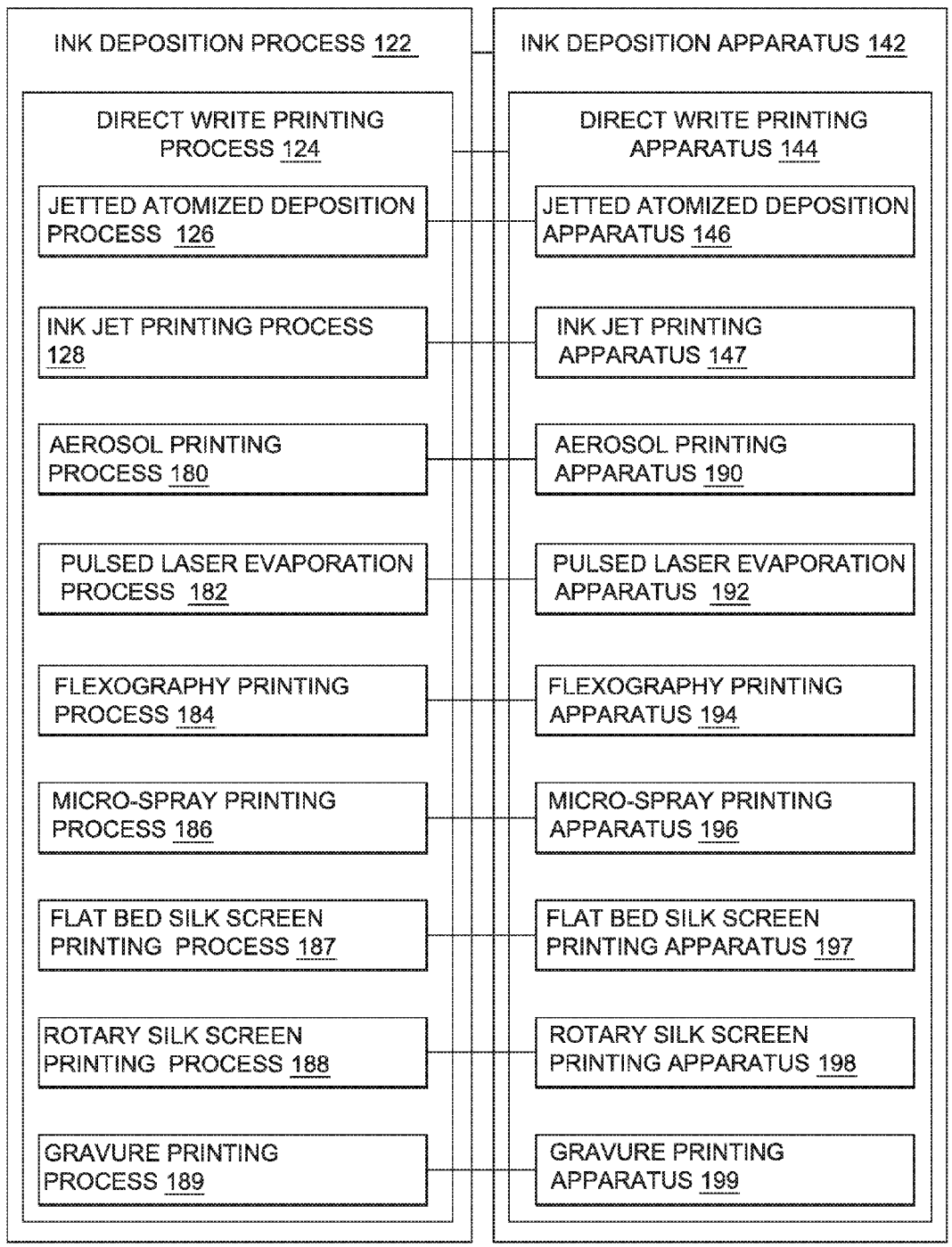
FIG. 10 is an illustration of a block diagram of embodiments of the ink deposition processes and ink deposition apparatuses that may be used to fabricate the PZT nanoparticle ink based piezoelectric sensor of the disclosure.

As shown in FIG. 5, the system 100 further comprises an ink deposition apparatus 142 (see also FIG. 6A) that deposits the PZT nanoparticle ink 104 onto a substrate 101 to form the PZT nanoparticle ink based piezoelectric sensor 110. The ink deposition apparatus 142 and an ink deposition process 122 using the ink deposition apparatus 142 do not require growth of PZT crystals 166 (see FIG. 6B) on the substrate 101. Because the PZT crystals 166 have already been grown in the PZT nanoparticles, the PZT nanoparticle ink 104 does not require a high temperature sintering process once deposited during the ink deposition process 122. The ink deposition apparatus 142 preferably comprises a direct write printing apparatus 144 (see FIG. 10). FIG. 10 is an illustration of a block diagram of embodiments of the ink deposition apparatuses and processes that may be used to fabricate the PZT nanoparticle ink based piezoelectric sensor 110 of the disclosure. As shown in FIG. 10, the direct write printing apparatus 144 may comprise a jetted atomized deposition apparatus 146, an ink jet printing apparatus 147, an aerosol printing apparatus 190, a pulsed laser evaporation apparatus 192, a flexography printing apparatus 194, a micro-spray printing apparatus 196, a flat bed silk screen printing apparatus 197, a rotary silk screen printing apparatus 198 or another suitable screen printing apparatus, a gravure printing apparatus 199 or another suitable press printing apparatus, or another suitable direct write printing apparatus 144.

Figure 6:
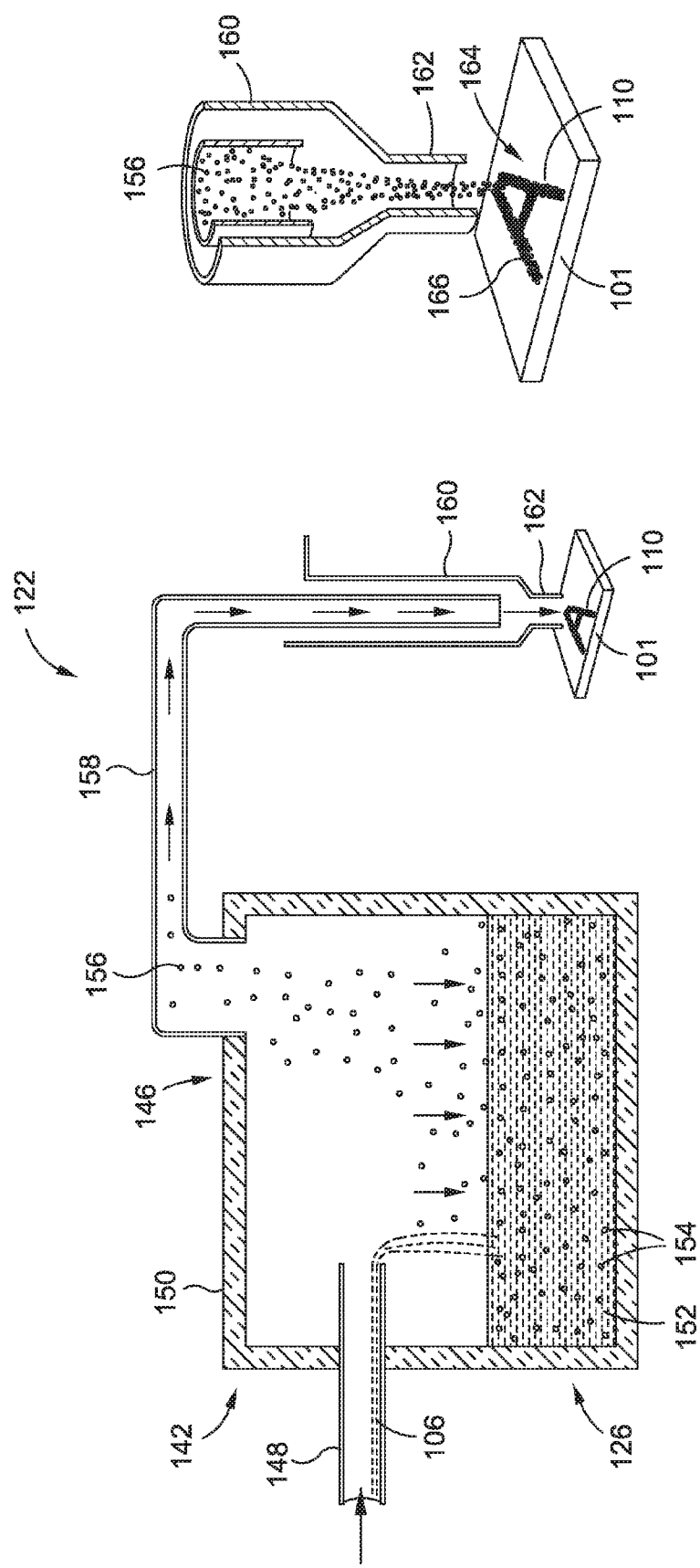
FIG. 6A is an illustration of a schematic view of one of the embodiments of an ink deposition process and apparatus for fabricating a PZT nanoparticle ink based piezoelectric sensor of the disclosure.
FIG. 6B is an illustration of a close-up view of the PZT piezoelectric nanoparticle ink based sensor being deposited on the substrate.

The PZT nanoparticle ink 104 may be deposited onto the substrate 101 with the ink deposition apparatus 142 via an ink deposition process 122 (see FIGS. 6A and 10). The ink deposition process 122 preferably comprises a direct write printing process 124 (see FIG. 10). As shown in FIG. 10, the direct write printing process 124 may comprise a jetted atomized deposition process 126, an ink jet printing process 128, an aerosol printing process 180, a pulsed laser evaporation process 182, a flexography printing process 184, a micro-spray printing process 186, a flat bed silk screen printing process 187, a rotary silk screen printing process 188 or another suitable screen printing process, a gravure printing process 189 or another suitable press printing, or another suitable direct write printing process 124.

Figure 2:
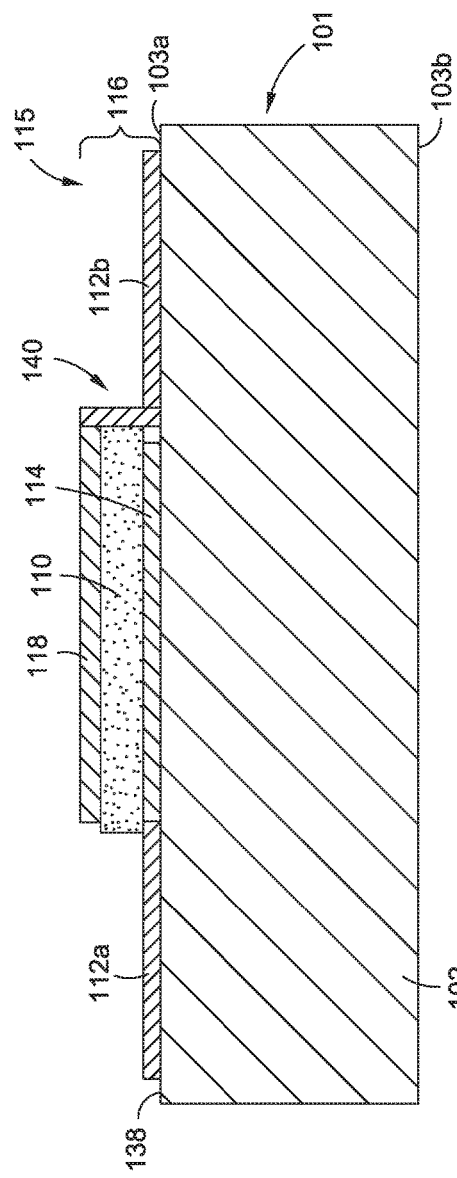
FIG. 2 is an illustration of a cross-sectional view of one of the embodiments of a deposited PZT nanoparticle ink based piezoelectric sensor assembly.
Figure 3:
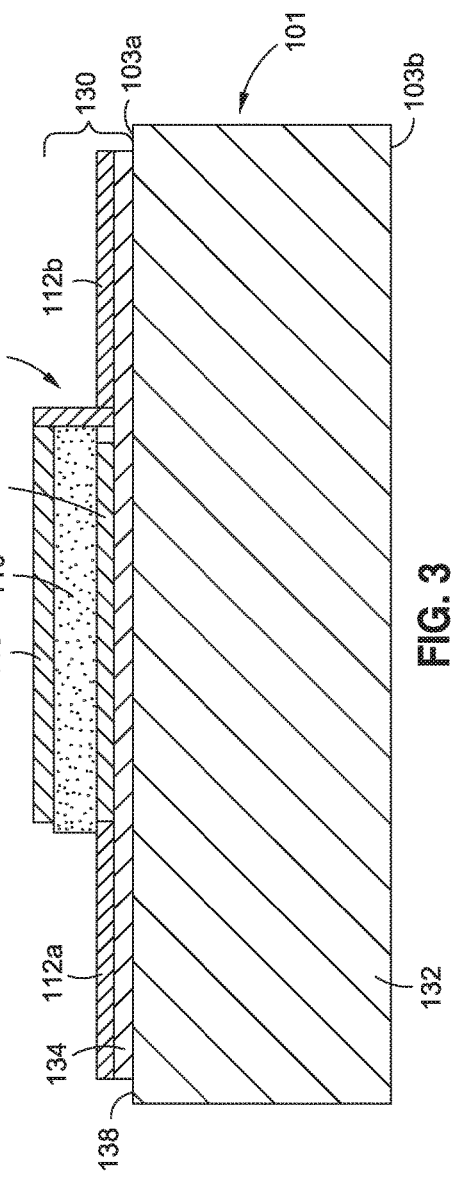
FIG. 3 is an illustration of a cross-sectional view of another one of the embodiments of a deposited PZT nanoparticle ink based piezoelectric sensor assembly.

As shown in FIG. 5, the substrate 101 may have a non-curved or planar surface 136, a curved or non-planar surface 138, or a combination of a non-curved or planar surface 136 and a curved or non-planar surface 138. As shown in FIG. 2, the substrate 101 may have a first surface 103a and a second surface 103b. The substrate 101 preferably comprises a composite material, a metallic material, a combination of a composite material and a metallic material, or another suitable material. As shown in the FIG. 2, the substrate 101 may comprise a composite structure 102. The composite structure 102 may comprise composite materials such as polymeric composites, fiber-reinforced composite materials, fiber-reinforced polymers, carbon fiber reinforced plastics (CFRP), glass-reinforced plastics (GRP), thermoplastic composites, thermoset composites, epoxy resin composites, shape memory polymer composites, ceramic matrix composites, or another suitable composite material. As shown in FIG. 3, the substrate 101 may comprise a metallic structure 132. The metallic structure 132 may comprise metal materials such as aluminum, stainless steel, titanium, alloys thereof, or another suitable metal or metal alloy. The substrate 101 may also comprise another suitable material.

FIG. 6A is an illustration of a schematic view of one of the embodiments of an ink deposition process 122 and an ink deposition apparatus 142 for fabricating the PZT nanoparticle ink based piezoelectric sensor 110 of the disclosure. An exemplary direct write printing process 124 and direct write printing apparatus 144 are shown in FIG. 6A, which shows the jetted atomized deposition process 126 and the jetted atomized deposition apparatus 146. As shown in FIG. 6A, nanoscale PZT ink nanoparticles 106 may be transferred via an inlet 148 into a mixing vessel 150 containing a solvent 152. The nanoscale PZT ink nanoparticles 106 are preferably mixed with the solvent 152 in the mixing vessel to form a PZT nanoparticle ink suspension 154. The PZT nanoparticle ink suspension 154 may be atomized by an ultrasonic mechanism 158 to form atomized PZT ink nanoparticles 156. The atomized PZT ink nanoparticles 156 may then be transferred through a nozzle body 160 and directed through a nozzle tip 162 to the substrate 101 for depositing and printing of the PZT nanoparticle ink based piezoelectric sensor 110 onto the substrate 101.

FIG. 6B is an illustration of a close-up view of the PZT piezoelectric nanoparticle ink based sensor 110 being deposited on the substrate 101. FIG. 6B shows the atomized PZT ink nanoparticles 156 in the nozzle body 160 and the nozzle tip 162 being deposited onto the substrate 101 to form the PZT nanoparticle ink based piezoelectric sensor 110. As shown in FIG. 6B, the PZT nanoparticle ink based piezoelectric sensor or sensors 110 may be deposited onto the substrate 101 in a customized shape 164, such as letters, designs, logos, or insignias, or geometric shapes such as circles, squares, rectangles, triangles, or other geometric shapes, or another desired customized shape. The ink deposition process 122 and the ink deposition apparatus 142 do not require growth of PZT crystals 166 on the substrate 101. Moreover, the deposited nanoscale PZT ink nanoparticles 106 contain a crystalline particle structure that does not require any post processing steps to grow the crystals. The PZT nanoparticle ink based piezoelectric sensor 110 may be deposited onto a surface of the structure 30 with one or more layers of insulation, coatings, or paint in between a body of the structure 30 and the PZT nanoparticle ink based piezoelectric sensor 110.

FIGS. 2 and 3 show embodiments of a deposited PZT nanoparticle ink based piezoelectric sensor assembly 115. FIG. 2 is an illustration of a cross-sectional view of one of the embodiments of a deposited PZT nanoparticle ink based piezoelectric sensor assembly 116 that is deposited onto a substrate 101 comprising a composite structure 102. The deposited PZT nanoparticle ink based piezoelectric sensor assembly 116 comprises the PZT nanoparticle ink based piezoelectric sensor 110 coupled to a power and communication wire assembly 140 acting as an actuator 141 (see FIG. 4). The power and communication wire assembly 140 is preferably formed of a conductive ink 168 (see FIG. 4) that may be deposited via the ink deposition apparatus 142 and via the ink deposition process 122 onto the substrate 101. The power and communication wire assembly 140 acting as an actuator 141 (see FIG. 4) may comprise a first conductive electrode 114, a second conductive electrode 118, a first conductive trace wire 112a, and a second conductive trace wire 112b. The first conductive electrode 114, the second conductive electrode 118, the first conductive trace wire 112a, and the second conductive trace wire 112b may be adjacent to the PZT nanoparticle ink based piezoelectric sensor 110.

FIG. 3 is an illustration of a cross-sectional view of another one of the embodiments of a deposited PZT nanoparticle ink based piezoelectric sensor assembly 130 that is deposited onto a substrate 101 comprising a metallic structure 132. The deposited PZT nanoparticle ink based piezoelectric sensor assembly 130 comprises the PZT nanoparticle ink based piezoelectric sensor 110 coupled to a power and communication wire assembly 140 acting as an actuator 141 (see FIG. 4). The power and communication wire assembly 140 is preferably formed of a conductive ink 168 (see FIG. 4) that may be deposited via the ink deposition apparatus 142 and via the ink deposition process 122 onto the substrate 101. The power and communication wire assembly 140 acting as the actuator 141 may comprise the first conductive electrode 114, the second conductive electrode 118, the first conductive trace wire 112a, and the second conductive trace wire 112b. The first conductive electrode 114, the second conductive electrode 118, the first conductive trace wire 112a, and the second conductive trace wire 112b may be adjacent to the PZT nanoparticle ink based piezoelectric sensor 110. As shown in FIG. 3, the deposited PZT nanoparticle ink based piezoelectric sensor assembly 130 further comprises an insulation layer 134 deposited between the substrate 101 comprising the metallic structure 132 and the PZT nanoparticle ink based piezoelectric sensor 110 coupled to the power and communication wire assembly 140. The insulation layer 134 may comprise an insulating polymer coating, a dielectric material, a ceramic material, a polymer material, or another suitable insulation material.

Figure 4:
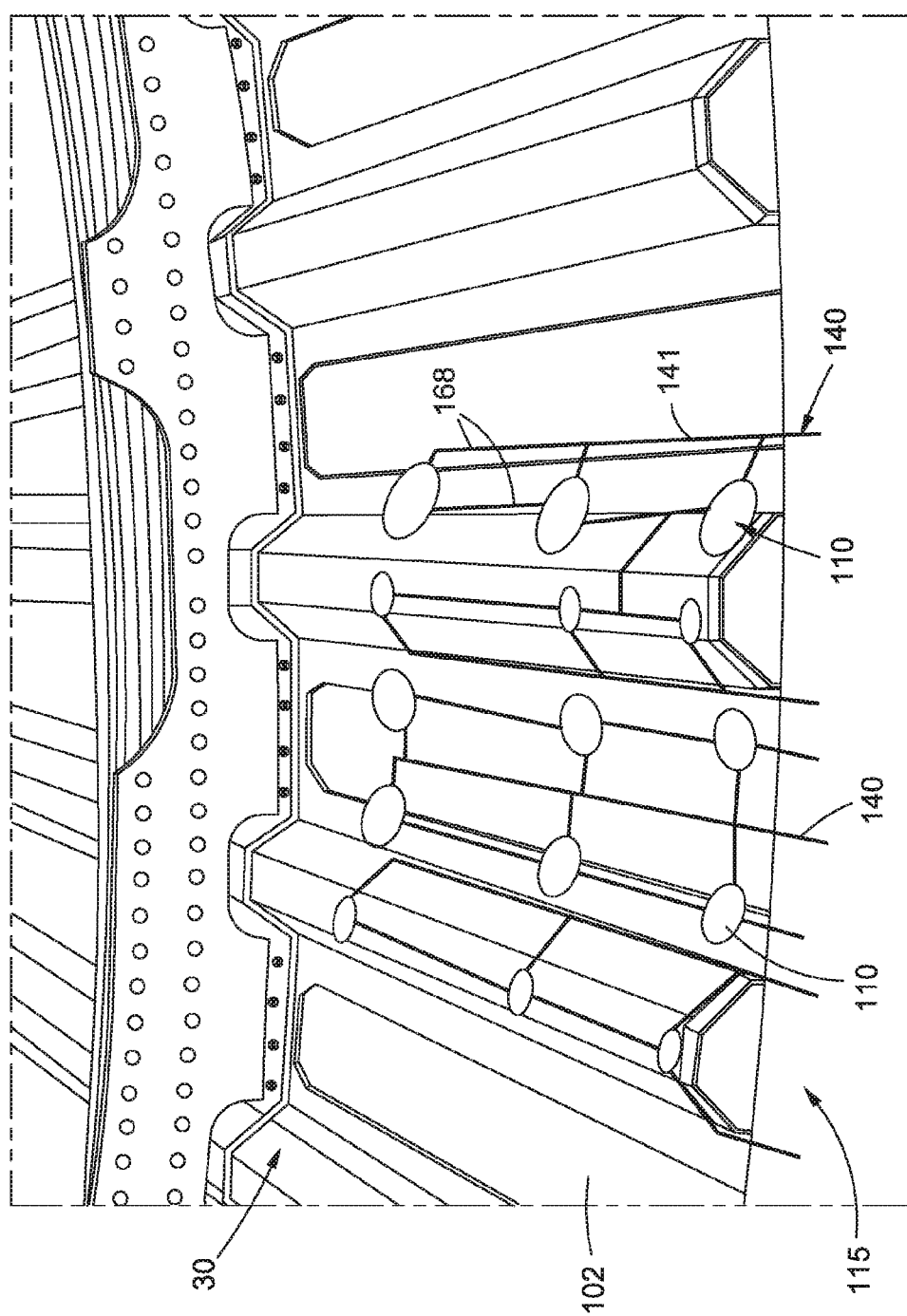
FIG. 4 is an illustration of a top perspective view of one of the embodiments of a deposited PZT nanoparticle ink based piezoelectric sensor assembly deposited on a composite structure.

FIG. 4 is an illustration of a top perspective view of the deposited PZT nanoparticle ink based piezoelectric sensor assembly 115 deposited on a composite structure 102. FIG. 4 shows a plurality of PZT nanoparticle ink based piezoelectric sensors 110 coupled to a plurality of power and communication wire assemblies 140, all deposited on the composite structure 102. Similarly, for a metallic structure 132, the deposited PZT nanoparticle ink based piezoelectric sensor assembly 130 may have a plurality of PZT nanoparticle ink based piezoelectric sensors 110 coupled to a plurality of power and communication wire assemblies 140, all deposited on the metallic structure 132.

Figure 7:
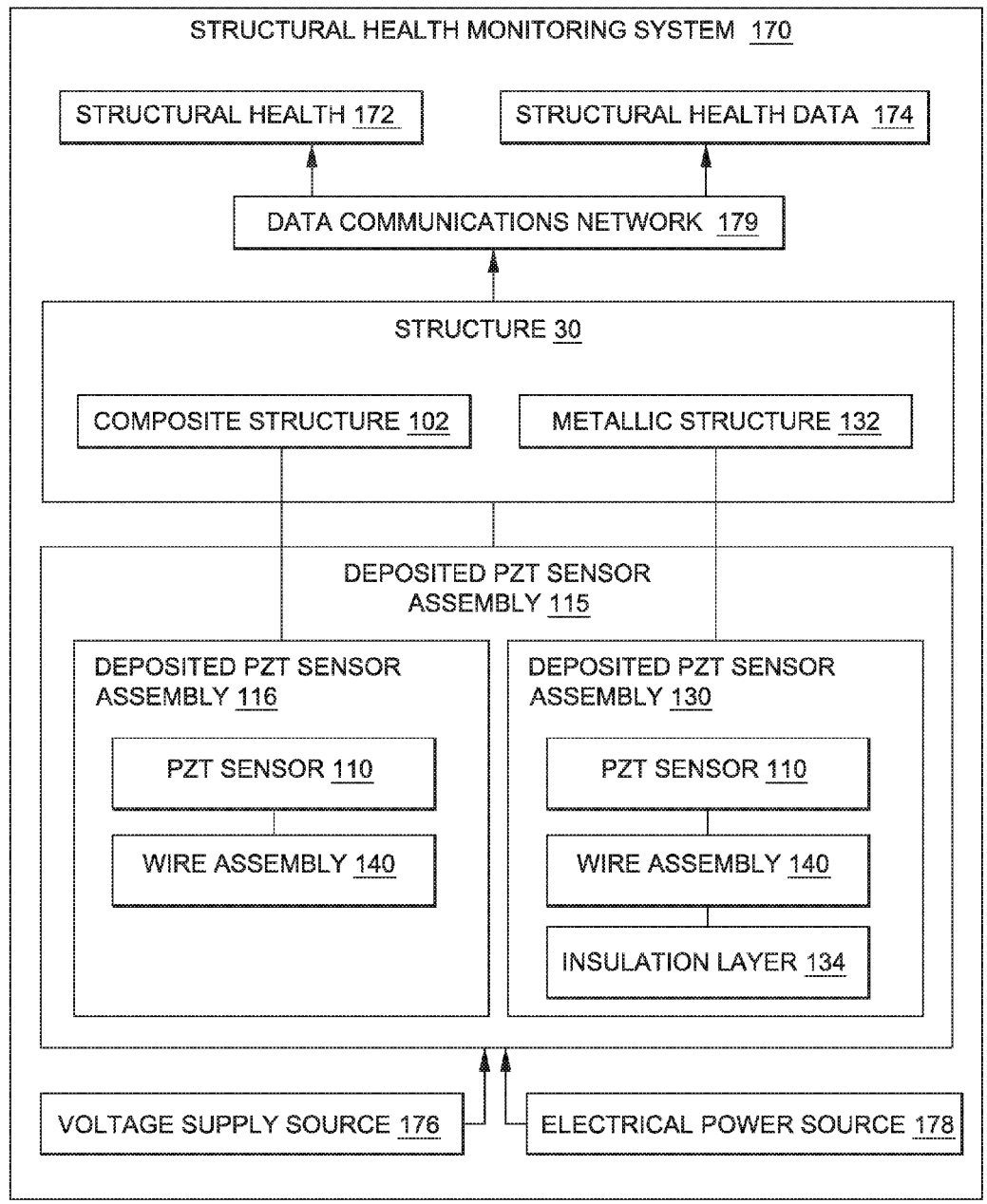
FIG. 7 is an illustration of a schematic diagram of one of the embodiments of a structural health monitoring system using the PZT nanoparticle ink based piezoelectric sensors of the disclosure.

The deposition of the PZT nanoparticle ink based piezoelectric sensors 110 on the substrate 101 or structure 30 (see FIG. 7) enables in situ installation of the PZT nanoparticle ink based piezoelectric sensors 110 for applications such as structural health monitoring. The PZT nanoparticle ink based piezoelectric sensors 110 may be a key enabler of high density structural health monitoring systems 170. FIG. 7 is an illustration of a block diagram of one of the embodiments of a structural health monitoring system 170 using the PZT nanoparticle ink based piezoelectric sensors 110 of the disclosure. Two or more nanoparticle ink based piezoelectric sensors 110 may be used to enable the structural health monitoring system 170 for monitoring structural health 172 of a structure 30, such as a composite structure 102 (see FIG. 1A) or a metallic structure 132 (see FIG. 3), or another suitable structure, and providing structural health data 174. The structural health data 174 may comprise disbonds, weak bonding, strain levels, moisture ingression, materials change, cracks, voids, delamination, porosity, or other suitable structural health data 174 or electromechanical properties or other irregularities which may adversely affect the performance of the structure 30.

The structural health monitoring system 170 preferably comprises a deposited PZT nanoparticle ink based piezoelectric sensor assembly 115 (see also FIGS. 2 and 3). The deposited PZT nanoparticle ink based piezoelectric sensor assembly 115 may comprise the deposited PZT nanoparticle ink based piezoelectric sensor assembly 116 (see FIG. 2), if used with the composite structure 102, and may comprise the deposited PZT nanoparticle ink based piezoelectric sensor assembly 130 (see FIG. 3), if used with a metallic structure 132. The structural health monitoring system 170 may further comprise a voltage supply source 176 that may be used for poling the PZT nanoparticle ink based piezoelectric sensor 110 prior to use in the structural health monitoring system 170. As used herein, the term "poling" means a process by which a strong electric field is applied across a material, usually at elevated temperatures, in order to orient or align dipoles or domains. The voltage supply source 176 may also drive some PZT nanoparticle ink based piezoelectric sensors 110 so that they become actuators 141 sending interrogating signals to other piezoelectric sensors 110.

As shown in FIG. 7, the structural health monitoring system 170 further comprises an electrical power source 178 for providing electrical power to the PZT nanoparticle ink based piezoelectric sensors 110. The electrical power source 178 may comprise batteries, voltage, RFID (radio frequency identification), magnetic induction transmission, or another suitable electrical power source. The electrical power source 178 may be wireless. As shown in FIG. 7, the system 170 may further comprise a digital data communications network 179 for retrieving and processing structural health data 174 from the PZT nanoparticle ink based piezoelectric sensors 110. The digital data communications network 179 may be wireless. The digital data communications network 179 may retrieve data received from the PZT nanoparticle ink based piezoelectric sensors 110, such as with a receiver (not shown), and may process data received from the PZT nanoparticle ink based piezoelectric sensors 110, such as with a computer processor (not shown). The digital data communications network 179 may be wireless.

Figure 8:
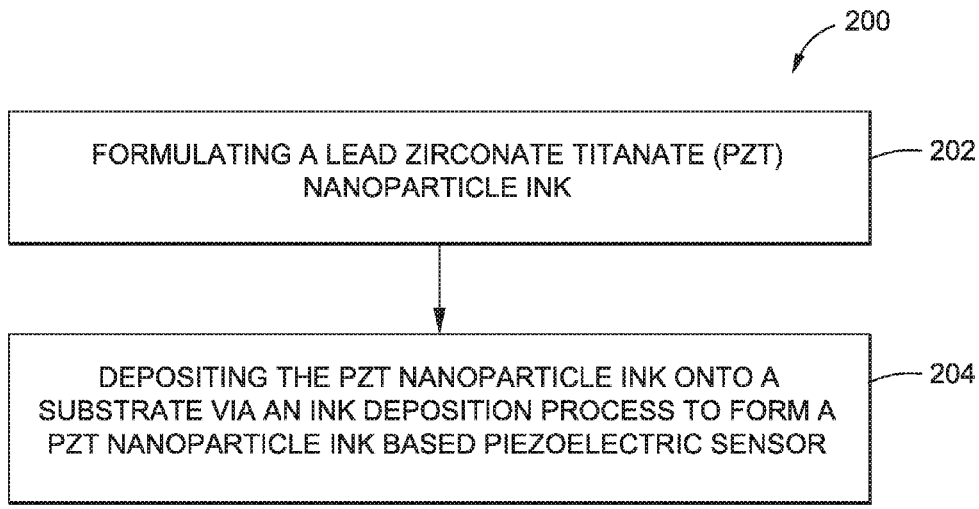
FIG. 8 is an illustration of a flow diagram of an embodiment of a method of the disclosure.

In an embodiment of the disclosure, there is provided a method 200 of fabricating a lead zirconate titanate (PZT) nanoparticle ink based piezoelectric sensor 110. FIG. 8 is an illustration of a flow diagram of an embodiment of the method 200 of the disclosure. The method 200 comprises step 202 of formulating a lead zirconate titanate (PZT) nanoparticle ink 104. The PZT nanoparticle ink 104 comprises nanoscale PZT ink nanoparticles 106. As discussed above, the PZT nanoparticle ink 104 preferably has a nanoscale PZT particle size in a range of from about 20 nanometers to about 1 micron. The PZT nanoparticle ink 104 may comprise a sol-gel based adhesion promoter 108 (see FIG. 5) for promoting adhesion of the PZT nanoparticle ink 104 to the substrate 101. The PZT nanoparticle ink 104 is formulated via the process as discussed in detail above.

The method 200 further comprises step 204 of depositing the PZT nanoparticle ink 104 onto the substrate 101 via an ink deposition process 122 to form the PZT nanoparticle ink based piezoelectric sensor 110. The ink deposition process 122 preferably comprises a direct write printing process 124 (see FIG. 10). As shown in FIG. 10, the direct write printing process 124 may comprise a jetted atomized deposition process 126, an ink jet printing process 128, an aerosol printing process 180, a pulsed laser evaporation process 182, a flexography printing process 184, a micro-spray printing process 186, a flat bed silk screen printing process 187, a rotary silk screen printing process 188 or another suitable screen printing process, a gravure printing process 189 or another suitable press printing, or another suitable direct write printing process.

The substrate 101 preferably comprises a composite material, a metallic material, a combination of a composite material and a metallic material, or another suitable material. The substrate 101 preferably comprises a first surface 103a and a second surface 103b. The substrate 101 may have a non-curved or planar surface 136 (see FIG. 5), a curved or non-planar surface 138 (see FIG. 5), or a combination of a non-curved or planar surface 136 (see FIG. 5) and a curved or non-planar surface 138 (see FIG. 5). The ink deposition process 122 does not require growth of PZT crystals 166 on the substrate 101. Moreover, the deposited nanoscale PZT ink nanoparticles 106 contain a crystalline particle structure which does not require any post processing steps to grow the crystals. The PZT nanoparticle ink based piezoelectric sensor 110 may be deposited onto the substrate 101 in a customized shape 164 (see FIG. 6B).

The PZT nanoparticle ink based piezoelectric sensor 110 may undergo a poling process with a voltage supply source 176 (see FIG. 7) prior to being used in the structural health monitoring system 170 for monitoring structural health 172 of a structure 30. The PZT nanoparticle ink based piezoelectric sensor 110 may be coupled to a power and communication wire assembly 140 formed from a conductive ink 168 deposited onto the substrate 101 via the ink deposition process 122 prior to being used in the structural health monitoring system 170. Two or more PZT nanoparticle ink based piezoelectric sensors 110 may be used to enable the structural health monitoring system 170.

Figure 9:
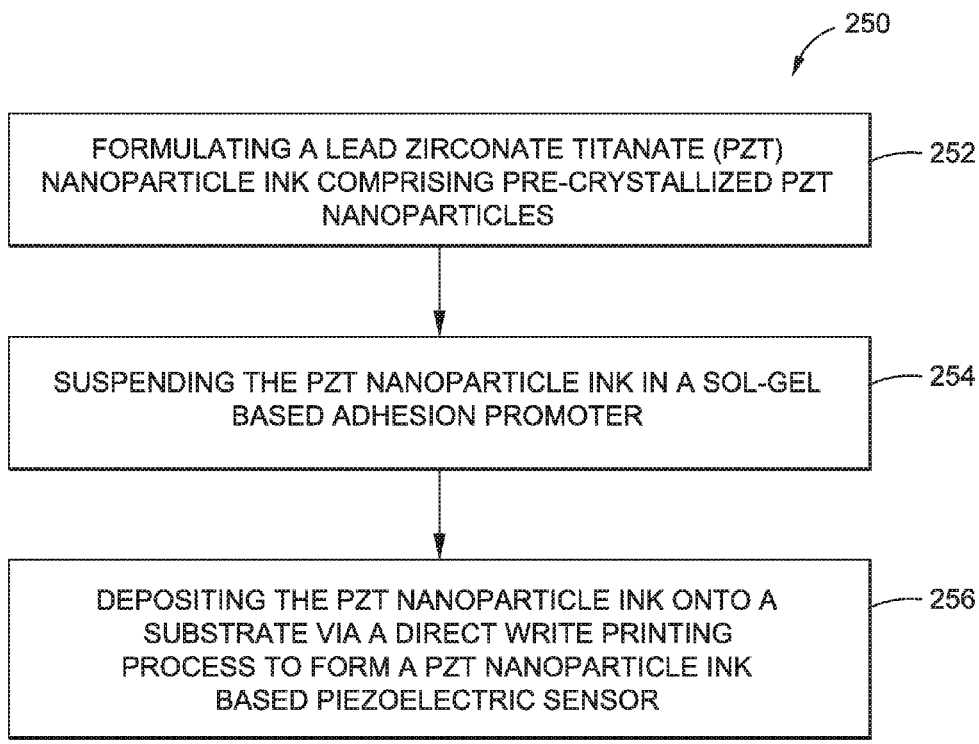
FIG. 9 is an illustration of a flow diagram of another embodiment of a method of the disclosure.

In another embodiment of the disclosure, there is provided a method 250 of fabricating a lead zirconate titanate (PZT) nanoparticle ink based piezoelectric sensor 110. FIG. 9 is an illustration of a flow diagram of another embodiment of the method 250 of the disclosure. The method 250 comprises step 252 of formulating a lead zirconate titanate (PZT) nanoparticle ink 104 comprising nanoscale PZT ink nanoparticles 106 that are pre-crystallized.

The method 250 further comprises step 254 of suspending the PZT nanoparticle ink 104 in a sol-gel based adhesion promoter 108. The method 250 further comprises step 256 of depositing the PZT nanoparticle ink 104 onto a substrate 101 via a direct write printing process 124 to form a PZT nanoparticle ink based piezoelectric sensor 110. As shown in FIG. 10, the direct write printing process 124 may comprise a jetted atomized deposition process 126, an ink jet printing process 128, an aerosol printing process 180, a pulsed laser evaporation process 182, a flexography printing process 184, a micro-spray printing process 186, a flat bed silk screen process 187, a rotary silk screen process 188 or another suitable screen printing process, a gravure printing process 189 or another suitable press printing, or another suitable direct write printing process 124.

The substrate 101 preferably comprises a composite material, a metallic material, a combination of a composite material and a metallic material, or another suitable material. The substrate 101 preferably comprises a first surface 103a and a second surface 103b. The substrate 101 may have a non-curved or planar surface 136 (see FIG. 5), a curved or non-planar surface 138 (see FIG. 5), or a combination of a non-curved or planar surface 136 (see FIG. 5) and a curved or non-planar surface 138 (see FIG. 5). The ink deposition process 122 does not require growth of PZT crystals 166 on the substrate 101. Moreover, the deposited nanoscale PZT ink nanoparticles 106 contain a crystalline particle structure which does not require any post processing steps to grow the crystals. The PZT nanoparticle ink based piezoelectric sensor 110 may be deposited onto the substrate 101 in a customized shape 164 (see FIG. 6B).

The PZT nanoparticle ink based piezoelectric sensor 110 may undergo a poling process with a voltage supply source 176 prior to being used in the structural health monitoring system 170 for monitoring structural health 172 of a structure 30. The PZT nanoparticle ink based piezoelectric sensor 110 may be coupled to a power and communication wire assembly 140 formed from a conductive ink 168 deposited onto the substrate 101 via the ink deposition process 122 prior to being used in the structural health monitoring system 170. Two or more PZT nanoparticle ink based piezoelectric sensors 110 may be used to enable the structural health monitoring system 170.

The structure 30 may comprise an aircraft, a spacecraft, an aerospace vehicle, a space launch vehicle, a rocket, a satellite, a rotorcraft, a watercraft, a boat, a train, an automobile, a truck, a bus, an architectural structure, a turbine blade, a medical device, electronic actuation equipment, a consumer electronic device, vibratory equipment, passive and active dampers, or another suitable structure. The system 100 and methods 200, 250 may be used across many industries including, for example, wind power generation (health monitoring of turbine blades), aerospace applications, military applications, medical applications, electronic actuation equipment, consumer electronic products, or any application where structures or materials require a monitoring system.

Embodiments of the system 100 and methods 200, 250 disclosed herein for fabricating the PZT nanoparticle ink based piezoelectric sensors 110 provide PZT nanoparticle ink based piezoelectric sensors 110 that may be used for a variety of applications including ultrasonic damage detection for composite and metallic structures, crack propagation detection sensors, pressure sensors, or another suitable sensor. For example, the PZT nanoparticle ink based piezoelectric sensors 110 of the system 100 and methods 200, 250 provide cradle to grave health monitoring of various components in aircraft such as damage detection for door surrounds, military platforms such as crack growth detection for military aircraft, and space systems such as cryo-tank health monitoring. The PZT nanoparticle ink based piezoelectric sensors 110 may provide data that was previously not available that may influence new and efficient designs which may reduce costs.

Using the direct write printing process 124, and for example, the jetted atomized deposition process 126, along with the formulated PZT nanoparticle ink 104, allows many PZT nanoparticle ink based piezoelectric sensors 110 to be deposited onto a substrate 101 or structure 30 and at a decreased cost as compared to known piezeoelectric sensors. Embodiments of the system 100 and methods 200, 250 disclosed herein provide PZT nanoparticle ink based piezoelectric sensors 110 that allow for the placement of the PZT nanoparticle ink based piezoelectric sensors 110 in numerous areas of a structure and at large quantities, both of which may be difficult with known piezoelectric sensors.

Moreover, embodiments of the system 100 and methods 200, 250 disclosed herein for fabricating the PZT nanoparticle ink based piezoelectric sensors 110 provide PZT nanoparticle ink based piezoelectric sensors 110 that are advantageous to known sensors because they do not require an adhesive to bond them to the structure, and this decreases the possibility that the PZT nanoparticle ink based piezoelectric sensors 110 may disbond from the structure. Embodiments of the system 100 and methods 200, 250 disclosed herein for fabricating the PZT nanoparticle ink based piezoelectric sensors 110 provide PZT nanoparticle ink based piezoelectric sensors 110 that are enabled by the availability of nanoscale PZT ink nanoparticles 106 having favorable piezoelectric properties and that are deposited onto a substrate or structure in a desired configuration for use without the use of adhesive. Because the PZT nanoparticle ink based piezoelectric sensors 110 may be deposited onto a substrate or structure with no adhesive between the PZT nanoparticle ink based piezoelectric sensors 110 and the substrate or structure, improved signal coupling into the structure being interrogated may be achieved.

Further, embodiments of the system 100 and methods 200, 250 disclosed herein for fabricating the PZT nanoparticle ink based piezoelectric sensors 110 provide PZT nanoparticle ink based piezoelectric sensors 110 do not require manual placement or installation on the substrate or structure and may be deposited or printed onto the substrate or structure, along with all the required power and communication wire assemblies, thus decreasing labor and installation costs, as well as decreasing complexity and weight of the structure. In addition, the PZT nanoparticle ink based piezoelectric sensors 110 may be fabricated from numerous direct write printing processes, including the jetted atomized deposition process 126; may be fabricated from nanoparticle size particles which have been pre-crystallized and may be more efficient than known sensors that have not been crystallized; do not require a high temperature sintering/crystallization process and thus reduce or eliminate possible damage to temperature sensitive substrates or structures; may be deposited onto curved or non-planar substrates or structures; have no or minimal physical geometry limitations and thus decrease the possibility of inadequate sensing capacities or inadequate actuation responses.

Finally, embodiments of the system 100 and methods 200, 250 disclosed herein for fabricating the PZT nanoparticle ink based piezoelectric sensors 110 provide PZT nanoparticle ink based piezoelectric sensors 110 that may be used to predict deterioration or weaknesses of a structure prior to the actual development of such deterioration or weaknesses, and thus, may increase reliability of the structure or structural component parts, and may reduce overall manufacturing and maintenance costs over the life of the structure or structural component parts; and that have the ability to predict, monitor, and diagnose the integrity, health, and fitness of a structure without having to disassemble or remove the structure or drill holes into the structure for insertion of any measurement tools.

Figure 17:
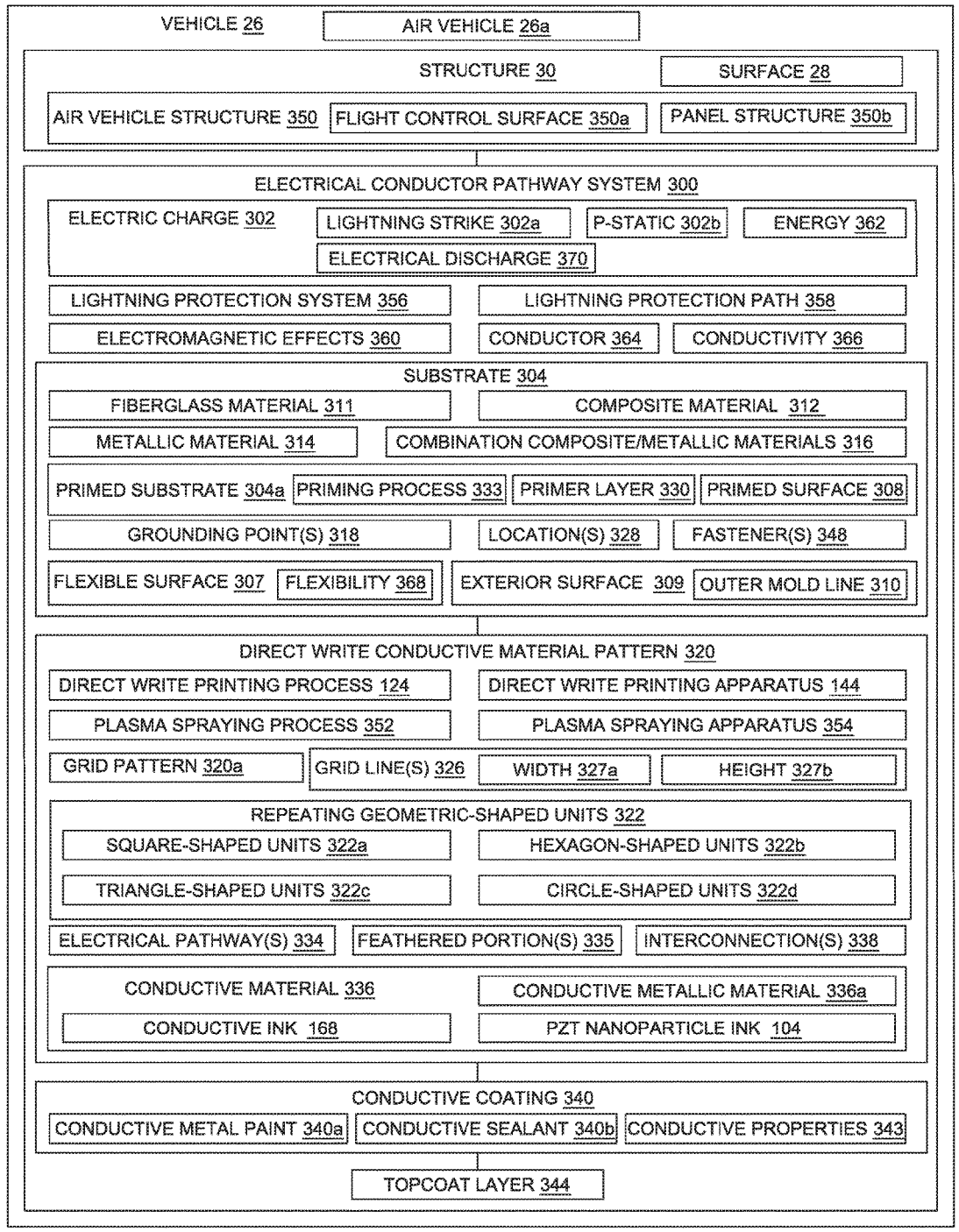
FIG. 17 is an illustration of a block diagram of an embodiment of a vehicle with an electrical conductor pathway system of the disclosure; and, FIG. 18 is an illustration of a flow diagram of an embodiment of another method of the disclosure.

Now referring to FIGS. 11A-14B, exemplary embodiments of an electrical conductor pathway system 300 with a direct write conductive material pattern 320 (see FIGS. 11A-11B) printed or deposited via the direct write printing process 124 (see FIGS. 10, 17), are shown. FIG. 17 is an illustration of a block diagram of an embodiment of a vehicle 26, such as an air vehicle 26a, incorporating the electrical conductor pathway system 300 (see FIGS. 11A-11B) of the disclosure.

The electrical conductor pathway system 300 (see FIGS. 11A-14B) is configured to divert an electric charge 302 (see FIG. 17). The electric charge 302 (see FIG. 17) may comprise, for example, one from a lightning strike 302a (see FIG. 17), one from precipitation static (P-static) 302b (see FIG. 17), or another type of electric charge 302 (see FIG. 17). As used herein, "precipitation static (P-static)" means electric charge built up on a surface. As used herein, "lightning strike" means electrical discharge on a surface.

The electrical conductor pathway system 300 (see FIGS. 11A-14B) is preferably configured to divert electric charge 302 (see FIG. 17) to an existing lighting protection system 356 (see FIG. 17) and functions as a lightning protection system 356 (see FIG. 17).

Figure 11A:
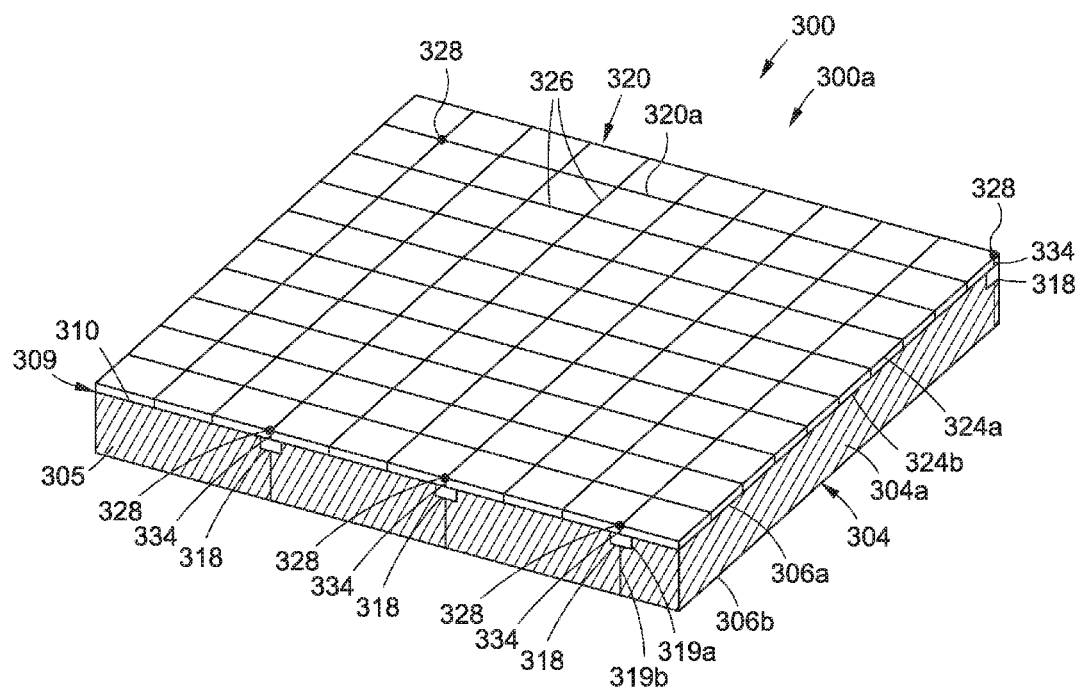
FIG. 11A is an illustration of a top perspective sectional view of an embodiment of an electrical conductor pathway system of the disclosure.
Figure 11B:
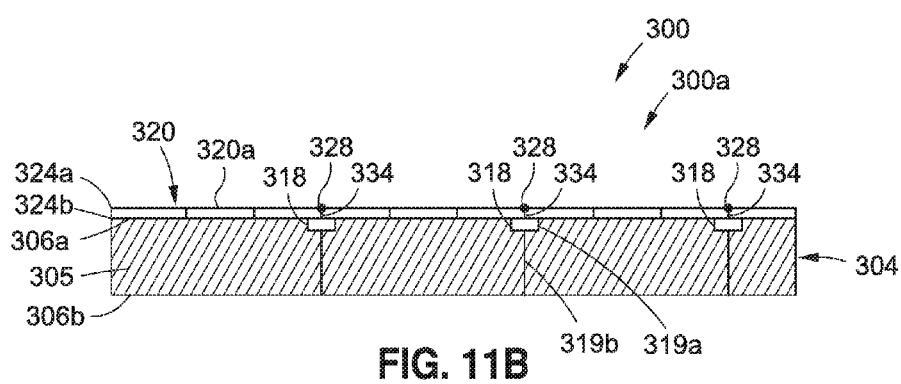
FIG. 11B is an illustration of a cross-sectional view of the electrical conductor pathway system of FIG. 11A.

FIG. 11A is an illustration of a top perspective sectional view of an embodiment of the electrical conductor pathway system 300, such as in the form of electrical conductor pathway system 300a, of the disclosure. FIG. 11B is an illustration of a cross-sectional view of the electrical conductor pathway system 300, such as in the form of electrical conductor pathway system 300a, of FIG. 11A.

As shown in FIGS. 11A-11B, the electrical conductor pathway system 300, such as in the form of electrical conductor pathway system 300a, comprises a substrate 304 having a first surface 306a to be printed on, a second surface 306b, and an interior 305. The substrate 304 (see FIGS. 11A-11B) may comprise one or more of, a fiberglass material 311 (see FIG. 17), a composite material 312 (see FIG. 17), a metallic material 314 (see FIG. 17), a combination 316 (see FIG. 17) of the composite material 312 (see FIG. 17) and the metallic material 314 (see FIG. 17), and other suitable materials.

The substrate 304 (see FIGS. 11A-11B) further has one or more grounding points 318 (see FIGS. 11A-11B). The grounding points 318 (see FIGS. 11A-11B) may be defined grounding points that are part of a lighting protection system 356 (see FIG. 17) that is pre-existing or predetermined, or that are part of another pre-existing or predetermined electrical system 56 (see FIG. 1C), environmental system 60 (see FIG. 1C), or other system on a vehicle 26 (see FIG. 17), such as an air vehicle 26a (see FIG. 17).

The grounding points 318 (see FIGS. 11A-11B) may be in the form of one or more of, one or more ground elements 319a (see FIG. 11A) with one or more ground connectors 319b (see FIG. 11A); one or more fasteners 348 (see FIG. 15); and other suitable grounding points 318 (see FIG. 17). Preferably, the grounding point 318 (see FIGS. 11A-15, 17) is made of or contains a conductive material 336 (see FIG. 17), such as a conductive metallic material 336a (see FIG. 17), and is a conductor 364 (see FIG. 17) that effectively conducts and grounds the electric charge 302 (see FIG. 17).

As shown in FIGS. 11A-11B, the electrical conductor pathway system 300, such as in the form of electrical conductor pathway system 300a, further comprises a direct write conductive material pattern 320 printed or deposited directly onto the first surface 306a via the direct write printing process 124 (see FIGS. 10, 17) using a direct write printing process apparatus 144 (see FIGS. 10, 17). In particular, as shown in FIG. 11A, the direct write conductive material pattern 320 is applied directly to an exterior surface 309, such as an outer mold line 310 of the exterior surface 309, and may be embossed on the exterior surface 309, rather than being embedded within the interior 305 of the substrate 304. The direct write conductive material pattern 320 (see FIGS. 11A, 17) preferably extends over and along the one or more grounding points 318 (see FIGS. 11A, 17) to divert or direct the electric charge 302 (see FIG. 17) or current to ground.

As shown in FIGS. 11A-11B, the direct write conductive material pattern 320 has a first side 324a and a second side 324b. The direct write conductive material pattern 320 (see FIGS. 11A-11B) may preferably comprise a grid pattern 320a (see FIGS. 11A-11B). The grid pattern 320a (see FIGS. 11A-11B) is preferably formed of a series of repeating geometric-shaped units 322 (see FIGS. 16A-16B), such as comprising one or more of, square-shaped units 322a (see FIG. 16A), hexagon-shaped units 322b (see FIG. 16B), triangle-shaped units 322c (see FIG. 16C), circle-shaped units 322d (see FIG. 17), and other suitable geometric-shaped units 322 (see FIG. 17), and are discussed in more detail below.

The direct write conductive material pattern 320 (see FIGS. 11A-11B), such as in the form of grid pattern 320a (see FIGS. 11A-11B), comprises one or more grid lines 326 (see FIG. 11A). The direct write printing process 124 (see FIGS. 10, 17) preferably creates grid lines 326 (see FIG. 11A), i.e., electrical pathways 334 (discussed below), with smooth edges rather than sharp edges, and that feather out along the grid lines 326 (see FIG. 11A) to form one or more feathered portions 335 (see FIG. 17). The one or more grid lines 326 (see FIG. 11A) may gradually feather out to the edge of the grid line 326 (see FIG. 11A), which preferably reduces discontinuities from the grid pattern 320a (see FIG. 11A).

The grid pattern 320a (see FIGS. 11A-11B, 17) may be in the form of a square-shaped grid having a size or dimensions of, for example, 2 (two) inches wide by 2 (two) inches long. However, the grid pattern 320a (see FIGS. 11A-11B) may have other suitable dimensions and may vary depending on the size and dimensions of the substrate 304 (see FIGS. 11A, 17) or surface 28 (see FIG. 17) the grid pattern 320a (see FIGS. 11A-11B), is being printed or deposited on.

Each grid line 326 (see FIG. 11A), i.e., electrical pathway 334 (discussed below), preferably has a width 327a (see FIG. 17) of from about 0.1 inch to about 0.3 inch. However, another suitable width 327a (see FIG. 17) may be used. Each grid line 326 (see FIG. 11A), i.e., electrical pathway 334 (discussed below), preferably has a height 327b (see FIG. 17) that is compatible with and would not interfere with any aerodynamic conditions or other surface conditions that the first surface 306a (see FIG. 11A) of the substrate 304 (see FIG. 11A), or surface 28 (see FIG. 17) of the structure 30 (see FIG. 17), operates under.

The width 327a (see FIG. 17) and height 327b (see FIG. 17) may vary depending on the substrate 304 (see FIGS. 11A, 17) or structure 30 (see FIG. 17) the direct write conductive material pattern 320 (see FIGS. 11A-11B), such as in the form of grid pattern 320a (see FIGS. 11A-11B), is being printed or deposited on. In addition, the width 327a (see FIG. 17) and height 327b (see FIG. 17) may vary depending on conductivity 366 (see FIG. 17) requirements of the first surface 306a (see FIG. 11A) of the substrate 304 (see FIG. 11A), or surface 28 (see FIG. 17) of the structure 30 (see FIG. 17), and amount of flexibility 368 (see FIG. 17) of the first surface 306a (see FIG. 11A) of the substrate 304 (see FIG. 11A), or surface 28 (see FIG. 17) of the structure 30 (see FIG. 17), that is, whether a flexible surface 307 (see FIG. 17) is present.

The direct write conductive material pattern 320 (see FIGS. 11A-11B), such as in the form of grid pattern 320a (see FIGS. 11A-11B), is preferably made of a conductive material 336 (see FIG. 17). The conductive material 336 (see FIG. 17) may comprise a conductive metallic material 336a (see FIG. 17), such as copper, aluminum, titanium, nickel, bronze, gold, silver, an alloy thereof, or another suitable conductive metallic material 336a. The conductive material 336 (see FIG. 17) may further comprise a conductive ink 168 (see FIG. 17) comprising a zirconate titanate (PZT) nanoparticle ink 104 (see FIG. 17). The conductive material 336 (see FIG. 17), as well as the shape, width 327a (see FIG. 17), and height 327b (see FIG. 17), of the direct write conductive material pattern 320 (see FIGS. 11A-11B), such as in the form of grid pattern 320a (see FIGS. 11A-11B), may be varied to maximize conductivity 366 (see FIG. 17) or flexibility 368 (see FIG. 17).

The direct write conductive material pattern 320 (see FIGS. 11A-11B) is printed or deposited via the direct write printing process 124 (see FIGS. 10, 17). The direct write printing process 124 (see FIGS. 10, 17) may comprise one of a jetted atomized deposition process 126 (see FIG. 10), an ink jet printing process 128 (see FIG. 10), an aerosol printing process 180 (see FIG. 10), a pulsed laser evaporation process 182 (see FIG. 10), a flexography printing process 184 (see FIG. 10), a micro-spray printing process 186 (see FIG. 10), a flat bed silk screen printing process 187 (see FIG. 10), a rotary silk screen printing process 188 (see FIG. 10), a gravure printing process 189 (see FIG. 10), a plasma spraying process 352 (see FIG. 17), or another suitable direct write printing process 124 (see FIGS. 10, 17).

With the plasma spraying process 352 (see FIG. 17), the conductive material 336 (see FIG. 17) may be deposited as a powder, a liquid, a suspension, or a wire, and is introduced into a plasma jet, emanating from a plasma torch. In the plasma jet, the conductive material 336 (see FIG. 17) is propelled towards the substrate 304 (see FIG. 11A). There, the molten droplets flatten, rapidly solidify, and form a deposit.

The direct write printing process 124 (see FIGS. 10, 17) is preferably performed or carried out using the direct write printing apparatus 144 (see FIGS. 10, 17). The direct write printing apparatus 144 (see FIGS. 10, 17) may comprise one of a jetted atomized deposition apparatus 146 (see FIG. 10), an ink jet printing apparatus 147 (see FIG. 10), an aerosol printing apparatus 190 (see FIG. 10), a pulsed laser evaporation apparatus 192 (see FIG. 10), a flexography printing apparatus 194 (see FIG. 10), a micro-spray printing apparatus 196 (see FIG. 10), a flat bed silk screen printing apparatus 197 (see FIG. 10), a rotary silk screen printing process 198 (see FIG. 10), a gravure printing process 199 (see FIG. 10), a plasma spraying apparatus 354 (see FIG. 17), or another suitable direct write printing apparatus 144 (see FIGS. 10, 17).

FIGS. 11A-11B show one or more locations 328 on the first side 324a where the direct write conductive material pattern 320 forms one or more electrical pathways 334 interconnected with the one or more grounding points 318. The one or more electrical pathways 334 (see FIGS. 11A-11B) interconnected with the one or more grounding points 318 (see FIGS. 11A-11B) divert the electric charge 302 (see FIG. 17) from the first surface 306a (see FIGS. 11A-11B), or the exterior surface 309 (see FIG. 11A), to the one or more grounding points 318 (see FIGS. 11A-11B). The one or more electrical pathways 334 (see FIGS. 11A-11B) form interconnections 338 (see FIG. 17) with the one or more grounding points 318 (see FIGS. 11A-11B) to divert or direct the electric charge 302 (see FIG. 17) to ground. Preferably, the electrical pathway 334 (see FIGS. 11A-11B) is a good conductor 364 (see FIG. 17) that gives very little or no resistance to the flow of the electric charge 302 (see FIG. 17).

Figure 12A:
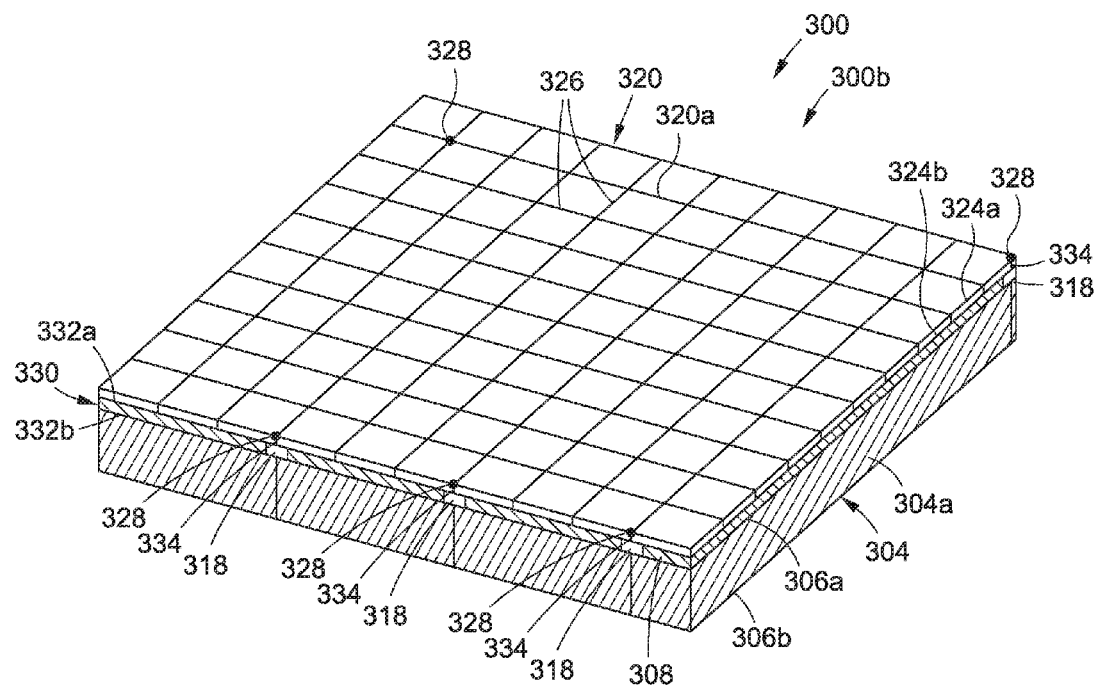
FIG. 12A is an illustration of a top perspective sectional view of another embodiment of an electrical conductor pathway system of the disclosure.
Figure 12B:
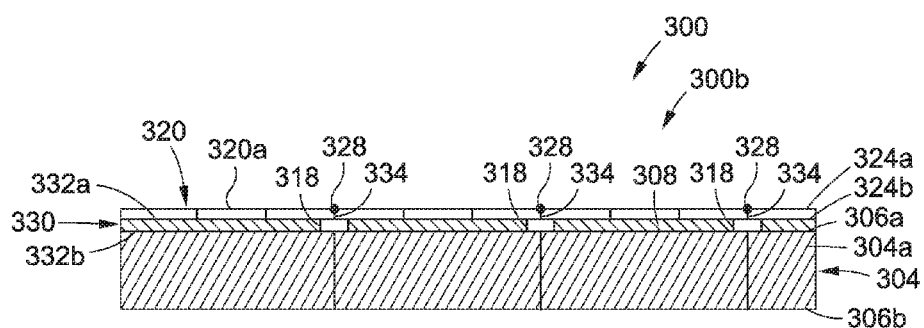
FIG. 12B is an illustration of a cross-sectional view of the electrical conductor pathway system of FIG. 12A.

FIG. 12A is an illustration of a top perspective sectional view of another embodiment of the electrical conductor pathway system 300, such as in the form of electrical conductor pathway system 300b, of the disclosure, that includes a primer layer 330. FIG. 12B is an illustration of a cross-sectional view of the electrical conductor pathway system 300, such as in the form of electrical conductor pathway system 300b, of FIG. 12A.

As shown in FIGS. 12A-12B, the electrical conductor pathway system 300, such as in the form of electrical conductor pathway system 300b, comprises the substrate 304 having the first surface 306a to be printed on and the second surface 306b, and having one or more grounding points 318.

In this embodiment shown in FIGS. 12A-12B, the substrate 304 has the primer layer 330 applied over the first surface 306a of the substrate 304 to form a primed substrate 304a having a primed surface 308. The primer layer 330 (see FIGS. 12A-12B) comprises a first side 332a (see FIGS. 12A-12B) and a second side 332b (see FIGS. 12A-12B). As shown in FIGS. 12A-12B, the second side 332b of the primer layer 330 is adjacent the first side 306a of the substrate 304.

The primer layer 330 (see FIGS. 12A-12B) may comprise an epoxy primer such as a water reducible epoxy primer, a solvent based epoxy primer, or another suitable epoxy primer, a urethane primer, or another suitable primer.

The substrate 304 (see FIGS. 12A-12B) may also undergo, in addition to application of the primer layer 330 (see FIGS. 12A-12B), or alternatively to application of the primer layer 330 (see FIGS. 12A-12B), a priming process 333 (see FIG. 17), or surface preparation process, to prime or prepare the first surface 306a of the substrate 304 (see FIGS. 12A-12B), or to prime or prepare an exterior surface 309 (see FIG. 11A) of a structure 30 (see FIG. 17), in order to obtain the primed substrate 304a (see FIGS. 12A-12B). For example, the priming process 333 (see FIG. 17), or surface preparation process, to prime or prepare the first surface 306a (see FIGS. 12A-12B), or to prime or prepare the exterior surface 309 (see FIG. 11A) of the structure 30 (see FIG. 17), such as an air vehicle structure 350 (see FIG. 17), may comprise cleaning with a cleaning agent or solvent, sanding or abrading, smoothing, polishing, etching, or another suitable priming process 333 (see FIG. 17) or surface preparation process.

As shown in FIGS. 12A-12B, the electrical conductor pathway system 300, such as in the form of electrical conductor pathway system 300b, further comprises the direct write conductive material pattern 320 printed directly onto the primed surface 308 via the direct write printing process 124 (see FIGS. 10, 17) using the direct write printing process apparatus 144 (see FIGS. 10, 17).

The direct write conductive material pattern 320 (see FIGS. 12A-12B), such as in the form of grid pattern 320a (see FIGS. 12A-12B), comprises one or more grid lines 326 (see FIG. 12A). As shown in FIGS. 12A-12B, the direct write conductive material pattern 320 has the first side 324a and the second side 324b. The first side 332a (see FIGS. 12A-12B) of the primer layer 330 (see FIGS. 12A-12B) is adjacent the second side 324b (see FIGS. 12A-12B) of the direct write conductive material pattern 320 (see FIGS. 12A-12B).

FIGS. 12A-12B show one or more locations 328 on the first side 324a where the direct write conductive material pattern 320 forms one or more electrical pathways 334 interconnected with the one or more grounding points 318. The one or more electrical pathways 334 (see FIGS. 12A-12B) interconnected with the one or more grounding points 318 (see FIGS. 12A-12B) divert the electric charge 302 (see FIG. 17) from the first surface 306a (see FIGS. 12A-12B) or the primed surface 308 (see FIGS. 12A-12B) to the one or more grounding points 318 (see FIGS. 12A-12B).

Figure 13A:
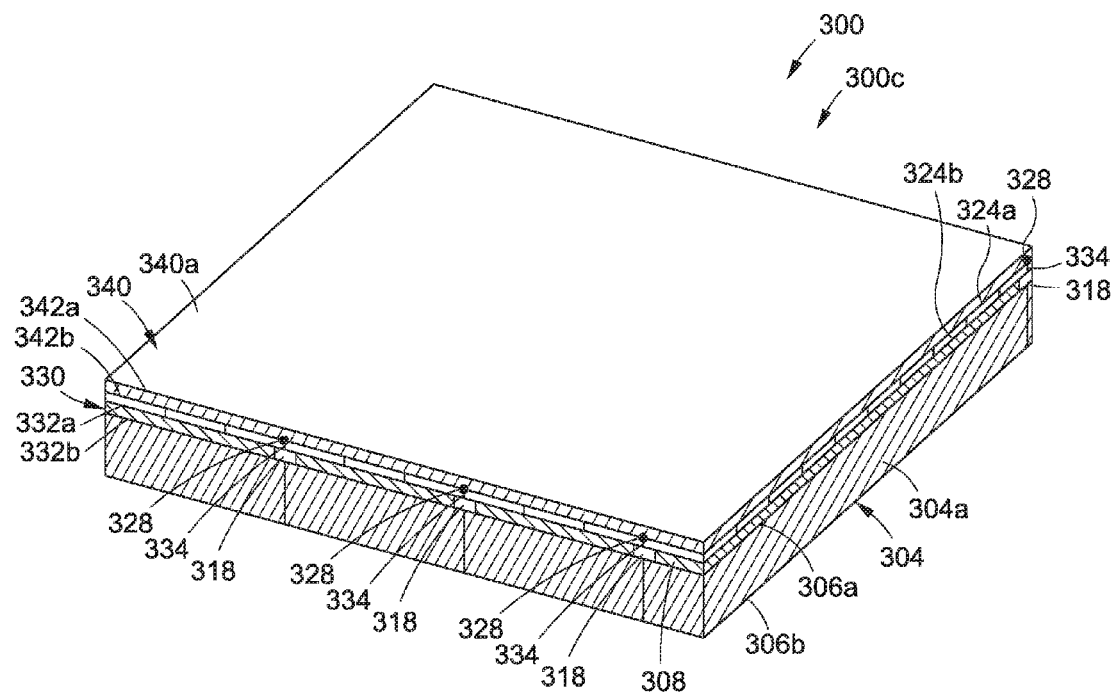
FIG. 13A is an illustration of a top perspective sectional view of yet another embodiment of an electrical conductor pathway system of the disclosure.
Figure 13B:
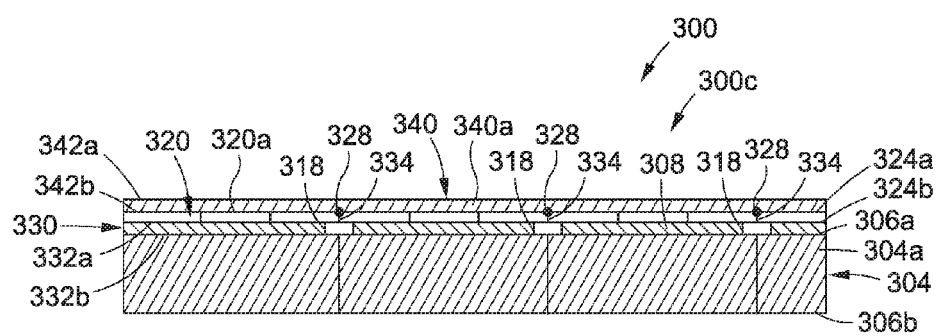
FIG. 13B is an illustration of a cross-sectional view of the electrical conductor pathway system of FIG. 13A.

FIG. 13A is an illustration of a top perspective sectional view of yet another embodiment of the electrical conductor pathway system 300, such as in the form of electrical conductor pathway system 300c, of the disclosure, that includes a primer layer 330 and a conductive coating 340. FIG. 13B is an illustration of a cross-sectional view of the electrical conductor pathway system 300, such as in the form of electrical conductor pathway system 300c, of FIG. 13A.

As shown in FIGS. 13A-13B, in this embodiment, the electrical conductor pathway system 300, such as in the form of electrical conductor pathway system 300c, further comprises the conductive coating 340 applied over the direct write conductive material pattern 320. The conductive coating 340 (see FIGS. 13A-13B) comprises a first side 342a (see FIGS. 13A-13B) and a second side 342a (see FIGS. 13A-13B). As shown in FIGS. 13A-13B, the second side 342b of the conductive coating 340 is adjacent the first side 324a of the direct write conductive material pattern 320.

In one embodiment, the conductive coating 340 (see FIGS. 13A-13B) may be in the form of a conductive metal paint 340a (see FIGS. 13A-13B, 17) made of, or containing, a conductive metallic material 336a (see FIG. 17) comprising one or more of, copper, aluminum, titanium, nickel, bronze, gold, silver, an alloy thereof, and other suitable conductive metallic materials 336a (see FIG. 17). In another embodiment, the conductive coating 340 (see FIGS. 13A-13B) may be in the form of a conductive sealant 340b (see FIG. 17) made of, or containing, a conductive metallic material 336a (see FIG. 17) comprising one or more of, copper, aluminum, titanium, nickel, bronze, gold, silver, an alloy thereof, and other suitable conductive metallic materials 336a (see FIG. 17). The conductive coating 340 (see FIGS. 13A-13B) provides an overall surface protection to dissipate or spread out the electric charge 302 (see FIG. 17), energy 362 (see FIG. 17) from a lightning strike 302a (see FIG. 17), or energy 362 (see FIG. 17) from precipitation static (P-static) 302b (see FIG. 17). The use of the metal loaded conductive coating 340 (see FIGS. 13A-13B) applied or deposited over the direct write conductive material pattern 320 (see FIGS. 13A, 17) preferably increases the conductivity 366 (see FIG. 17) of the electrical conductor pathway system 300 and provides a continuous conductive surface over the direct write conductive material pattern 320 (see FIGS. 13A, 17) for increased lightning protection.

As shown in FIGS. 13A-13B, the electrical conductor pathway system 300, such as in the form of electrical conductor pathway system 300c, comprises the substrate 304 having the first surface 306a to be printed on and the second surface 306b, and having one or more grounding points 318.

In this embodiment shown in FIGS. 13A-13B, the substrate 304 has the primer layer 330 applied over the first surface 306a of the substrate 304 to form the primed substrate 304a having the primed surface 308. The primer layer 330 (see FIGS. 13A-13B) comprises the first side 332a (see FIGS. 13A-13B) and the second side 332b (see FIGS. 13A-13B). As shown in FIGS. 13A-13B, the second side 332b of the primer layer 330 is adjacent the first side 306a of the substrate 304.

As shown in FIGS. 13A-13B, the electrical conductor pathway system 300, such as in the form of electrical conductor pathway system 300c, further comprises the direct write conductive material pattern 320 printed directly onto the primed surface 308 via the direct write printing process 124 (see FIGS. 10, 17) using the direct write printing process apparatus 144 (see FIGS. 10, 17).

The direct write conductive material pattern 320 (see FIGS. 13A-13B), such as in the form of grid pattern 320a (see FIGS. 13A-13B), comprises one or more grid lines 326 (see FIG. 13A). As shown in FIGS. 13A-13B, the direct write conductive material pattern 320 has the first side 324a and the second side 324b. The first side 332a (see FIGS. 13A-13B) of the primer layer 330 (see FIGS. 13A-13B) is adjacent the second side 324b (see FIGS. 13A-13B) of the direct write conductive material pattern 320 (see FIGS. 13A-13B).

FIGS. 13A-13B show one or more locations 328 on the first side 324a where the direct write conductive material pattern 320 forms one or more electrical pathways 334 interconnected with the one or more grounding points 318. The one or more electrical pathways 334 (see FIGS. 13A-13B) interconnected with the one or more grounding points 318 (see FIGS. 13A-13B) divert the electric charge 302 (see FIG. 17) from the first surface 306a (see FIGS. 13A-13B) or the primed surface 308 (see FIGS. 13A-13B) to the one or more grounding points 318 (see FIGS. 13A-13B).

Figure 14A:
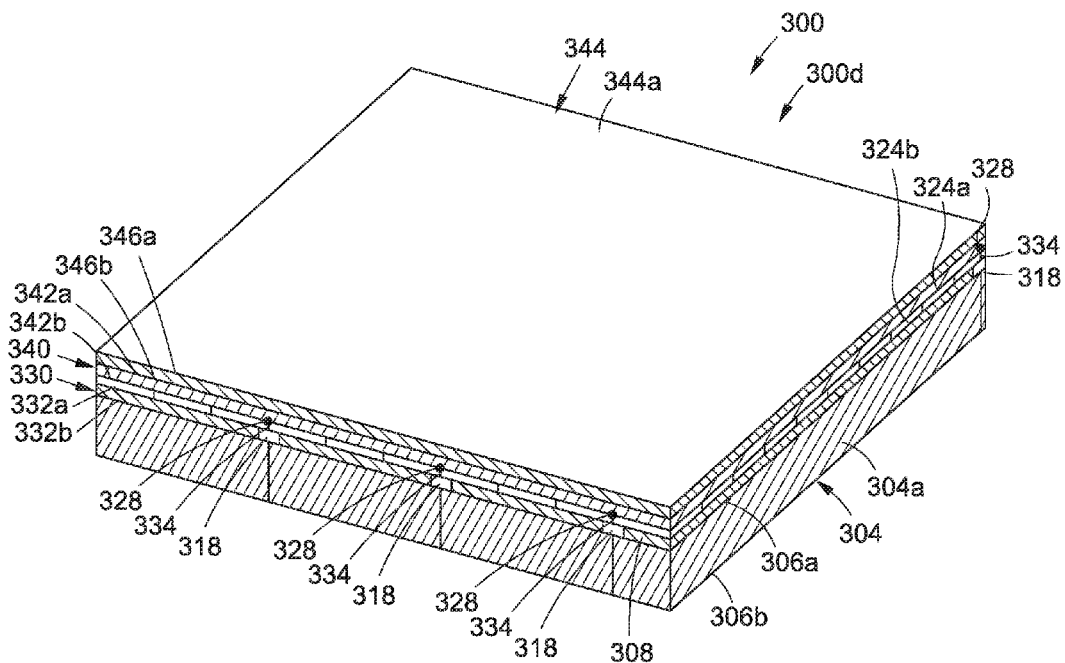
FIG. 14A is an illustration of a top perspective sectional view of yet another embodiment of an electrical conductor pathway system of the disclosure.
Figure 14B:
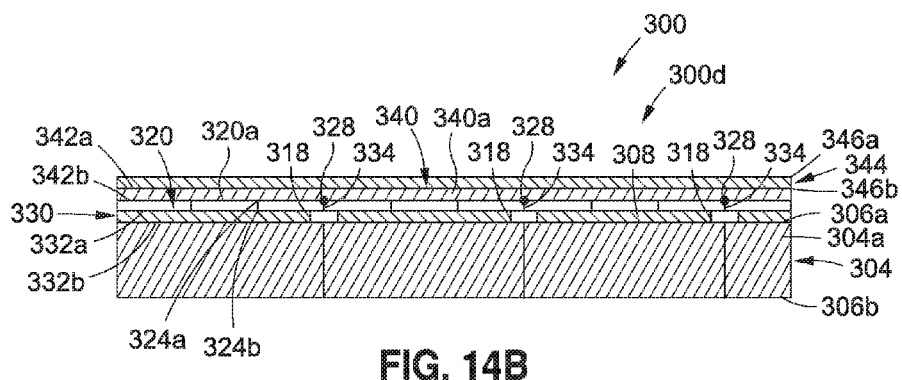
FIG. 14B is an illustration of a cross-sectional view of the electrical conductor pathway system of FIG. 14A.

FIG. 14A is an illustration of a top perspective sectional view of yet another embodiment of the electrical conductor pathway system 300, such as in the form of electrical conductor pathway system 300d, of the disclosure, that includes a primer layer 330, a conductive coating 340, and a topcoat layer 344. FIG. 14B is an illustration of a cross-sectional view of the electrical conductor pathway system 300, such as in the form of electrical conductor pathway system 300d, of FIG. 14A.

As shown in FIGS. 14A-14B, in this embodiment, the electrical conductor pathway system 300, such as in the form of electrical conductor pathway system 300d, further comprises the topcoat layer 344 applied over the conductive coating 340. The topcoat layer 344 (see FIGS. 14A-14B) comprises a first side 346a (see FIGS. 14A-14B) and a second side 346b (see FIGS. 14A-14B). As shown in FIGS. 14A-14B, the second side 346b of the topcoat layer 344 is adjacent the first side 342a of the conductive coating 340.

The topcoat layer 344 (see FIGS. 14A-14B) may function as a protective coating over all, or substantially all, of the conductive coating 340 (see FIGS. 14A-14B), or may be applied for visual or aesthetic appearance purposes. The topcoat layer 344 (see FIGS. 14A-14B) may comprise a polyurethane paint or coating, a urethane paint or coating, an acrylic paint or coating, an adhesive coating, a combination thereof, or another suitable topcoat layer 344 (see FIG. 17). Preferably, the topcoat layer 344 (see FIGS. 14A-14B) is durable, abrasion and chemical resistant, heat resistant, and visually appealing.

As shown in FIGS. 14A-14B, the electrical conductor pathway system 300, such as in the form of electrical conductor pathway system 300d, further comprises the conductive coating 340 applied over the direct write conductive material pattern 320. The conductive coating 340 (see FIGS. 14A-14B) comprises the first side 342a (see FIGS. 14A-14B) and the second side 342a (see FIGS. 14A-14B). As shown in FIGS. 14A-14B, the second side 342a of the conductive coating 340 is adjacent the first side 324a of the direct write conductive material pattern 320.

As shown in FIGS. 14A-14B, the electrical conductor pathway system 300, such as in the form of electrical conductor pathway system 300d, comprises the substrate 304 having the first surface 306a to be printed on and the second surface 306b, and having one or more grounding points 318.

In this embodiment shown in FIGS. 14A-14B, the substrate 304 has the primer layer 330 applied over the first surface 306a of the substrate 304 to form the primed substrate 304a having the primed surface 308. The primer layer 330 (see FIGS. 14A-14B) comprises the first side 332a (see FIGS. 14A-14B) and the second side 332b (see FIGS. 14A-14B). As shown in FIGS. 14A-14B, the second side 332b of the primer layer 330 is adjacent the first side 306a of the substrate 304.

As shown in FIGS. 14A-14B, the electrical conductor pathway system 300, such as in the form of electrical conductor pathway system 300d, further comprises the direct write conductive material pattern 320 printed directly onto the primed surface 308 via the direct write printing process 124 (see FIGS. 10, 17) using the direct write printing process apparatus 144 (see FIGS. 10, 17).

The direct write conductive material pattern 320 (see FIGS. 14A-14B), such as in the form of grid pattern 320a (see FIGS. 14A-14B), comprises one or more grid lines 326 (see FIG. 14A). As shown in FIGS. 14A-14B, the direct write conductive material pattern 320 has the first side 324a and the second side 324b. The first side 332a (see FIGS. 14A-14B) of the primer layer 330 (see FIGS. 14A-14B) is adjacent the second side 324b (see FIGS. 14A-14B) of the direct write conductive material pattern 320 (see FIGS. 14A-14B).

FIGS. 14A-14B show one or more locations 328 on the first side 324a where the direct write conductive material pattern 320 forms one or more electrical pathways 334 interconnected with the one or more grounding points 318. The one or more electrical pathways 334 (see FIGS. 14A-14B) interconnected with the one or more grounding points 318 (see FIGS. 14A-14B) divert the electric charge 302 (see FIG. 17) from the first surface 306a (see FIGS. 14A-14B) or the primed surface 308 (see FIGS. 14A-14B) to the one or more grounding points 318 (see FIGS. 14A-14B).

Figure 15:
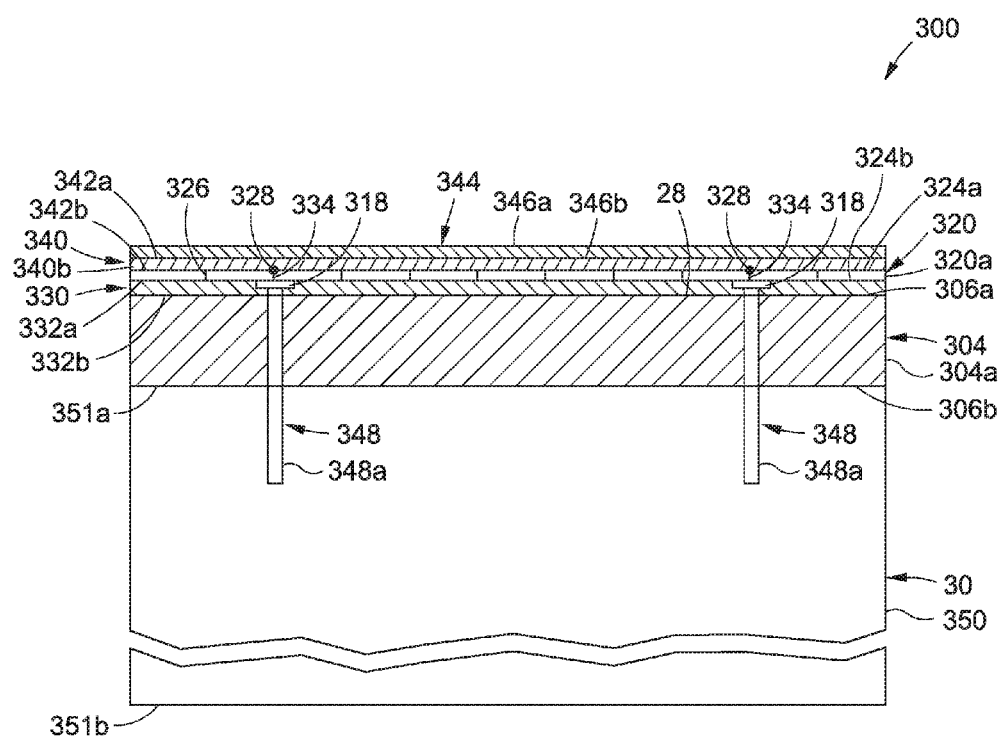
FIG. 15 is an illustration of a cross-sectional view of an embodiment of an electrical conductor pathway system having grounding points in the form of fasteners.

FIG. 15 is an illustration of a cross-sectional view of an embodiment of the electrical conductor pathway system 300 having grounding points 318 in the form of fasteners 348. As shown in FIG. 15, one or more grounding points 318 in the form of fasteners 348, such as bolts 348a, are used to attach the substrate 304, to the structure 30, such as an air vehicle structure 350, for example, a panel structure 350b (see FIG. 17), a stringer, a rib, a spar, or another suitable air vehicle structure 350. The fasteners 348 (see FIG. 15) may be inserted through a surface 28 (see FIG. 15), such as a flight control surface 350a (see FIG. 17), of the substrate 304 to attach to the structure 30 (see FIG. 15).

As shown in FIG. 15, the electrical conductor pathway system 300 is integrated onto the air vehicle structure 350, and the direct write conductive material pattern 320, such as grid pattern 320a, is applied directly to and extends over the fasteners 348 and is sealed with a conductive coating 340, such as in the form of a conductive sealant 340b. An optional topcoat layer 344 (see FIG. 15) may be applied over the conductive coating 340 (see FIG. 15). An optional primer layer 330 (see FIG. 15) may be applied over the substrate 304 (see FIG. 15).

As shown in FIG. 15, the substrate 304 has the first surface 306a and the second surface 306b. The structure 30 (see FIG. 15), such as in the form of air vehicle structure 350 (see FIG. 15), comprises a first side 351a (see FIG. 15) and a second side 351b (see FIG. 15). As shown in FIG. 15, the first side 351a of the structure 30 is adjacent the second surface 306b of the substrate 304.

As further shown in FIG. 15, the optional primer layer 330 has the first side 332a and the second side 332b, the conductive coating 340 has the first side 342a and the second side 342b, and the optional topcoat layer 344 has the first side 346a and the second side 346b. FIG. 15 shows the locations 328 of the electrical pathways 334 to the grounding points 318, such as in the form of fasteners 348.

Figure 16A:
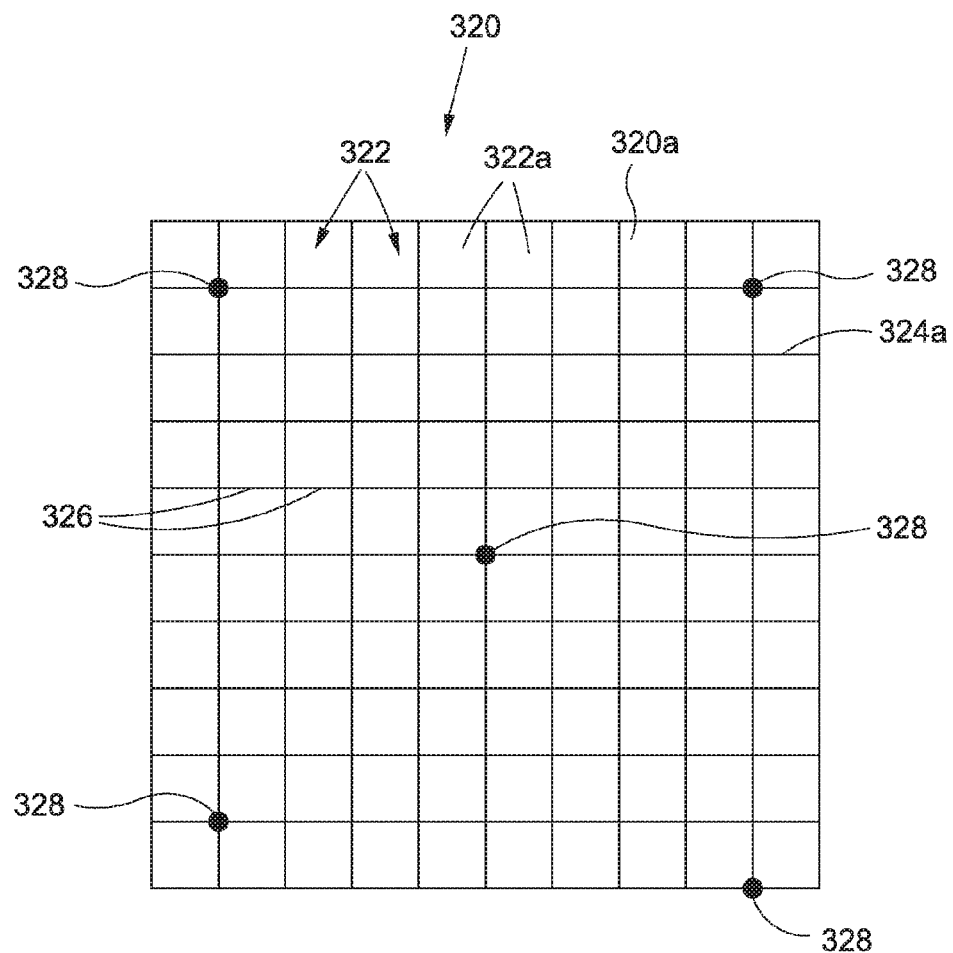
FIG. 16A is an illustration of a top view of an embodiment of a direct write conductive material pattern that may be used in an embodiment of an electrical conductor pathway system of the disclosure.

FIG. 16A is an illustration of a top view of an embodiment of a direct write conductive material pattern 320, such as in the form of grid pattern 320a, that is used in an embodiment of the electrical conductor pathway system 300 (see FIGS. 11A-14B, 17) of the disclosure. FIG. 16A shows the first side 324a of the grid pattern 320a comprising repeating geometric-shaped units 322, such as square-shaped units 322a, made up of grid lines 326. As further shown in FIG. 16A, the grid pattern 320a includes one or more locations 328 for the electrical pathways 334 (see FIGS. 11A-11B) to the grounding points 318 (see FIGS. 11A-14B).

Figure 16B:
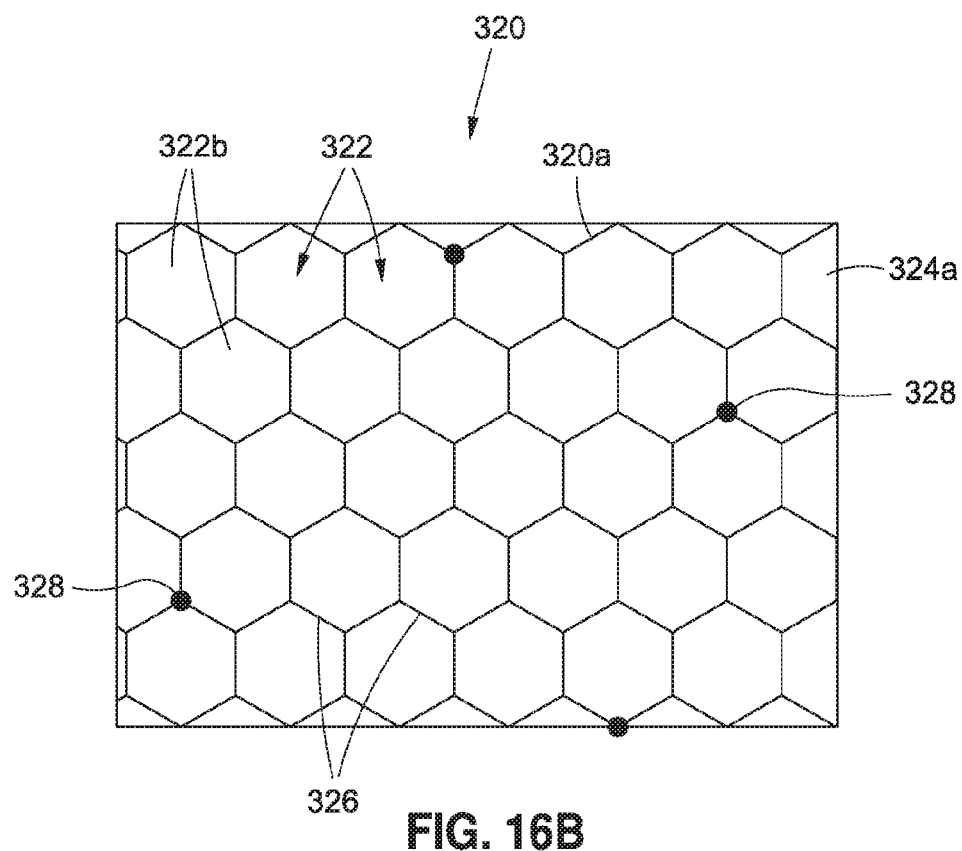
FIG. 16B is an illustration of a top view of another embodiment of a direct write conductive material pattern that may be used in an embodiment of an electrical conductor pathway system of the disclosure.

FIG. 16B is an illustration of a top view of another embodiment of a direct write conductive material pattern 320, such as in the form of grid pattern 320a, that is used in an embodiment of the electrical conductor pathway system 300 (see FIGS. 11A-14B, 17) of the disclosure. FIG. 16B shows the first side 324a of the grid pattern 320a comprising repeating geometric-shaped units 322, such as hexagon-shaped units 322b, made up of grid lines 326. As further shown in FIG. 16B, the grid pattern 320a includes one or more locations 328 for the electrical pathways 334 (see FIGS. 11A-11B) to the grounding points 318 (see FIGS. 11A-14B).

Figure 16C:
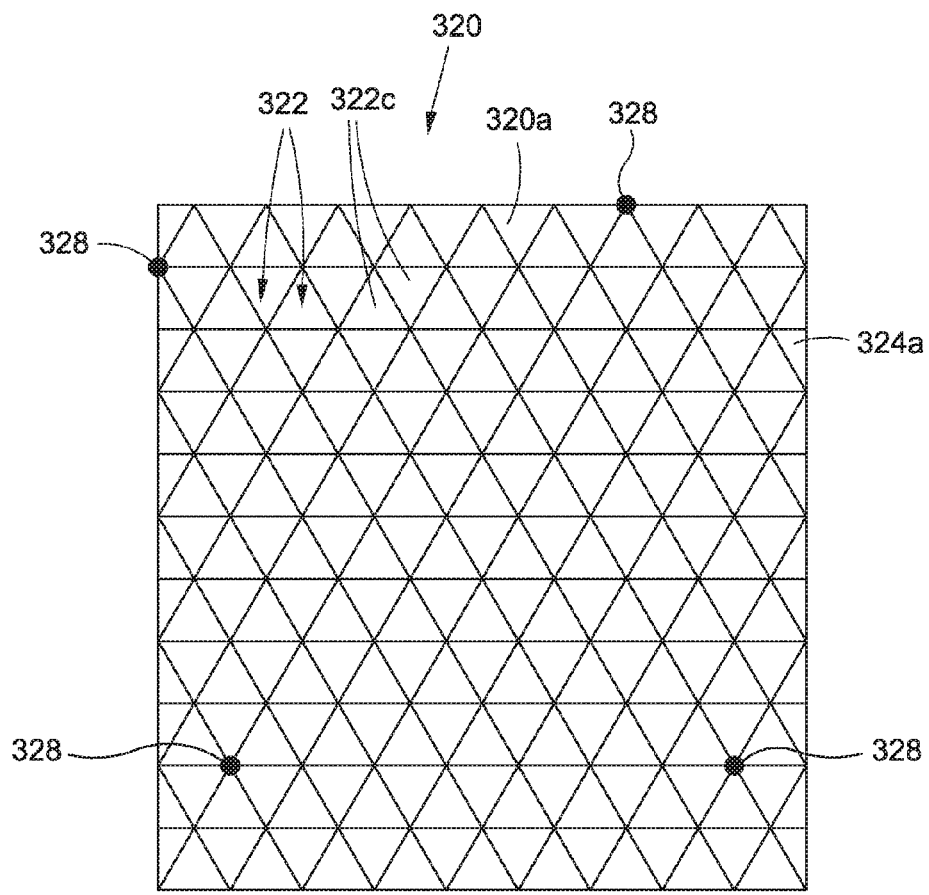
FIG. 16C is an illustration of a top view of yet another embodiment of a direct write conductive material pattern that may be used in an embodiment of an electrical conductor pathway system of the disclosure.

FIG. 16C is an illustration of a top view of yet another embodiment of a direct write conductive material pattern that is used in an embodiment of the electrical conductor pathway system 300 (see FIGS. 11A-14B, 17) of the disclosure. FIG. 16C shows the first side 324a of the grid pattern 320a comprising repeating geometric-shaped units 322, such as triangle-shaped units 322c, made up of grid lines 326. As further shown in FIG. 16C, the grid pattern 320a includes one or more locations 328 for the electrical pathways 334 (see FIGS. 11A-11B) to the grounding points 318 (see FIGS. 11A-14B).

FIG. 17 is an illustration of a block diagram of an embodiment of a vehicle 26, such as an air vehicle 26a, with an electrical conductor pathway system 300 of the disclosure. As shown in FIG. 17, the vehicle 26, such as air vehicle 26a, comprises a structure 30, such as an air vehicle structure 350, having the electrical conductor pathway system 300. The structure 30 (see FIG. 17) has a surface 28 (see FIG. 17), such as a flight control surface 350a (see FIG. 17). The air vehicle structure 350 (see FIG. 17) may comprise a panel structure 350b (see FIG. 17), a stringer, a rib, a spar, or another suitable air vehicle structure 350 (see FIG. 17).

As shown in FIG. 17, the electrical conductor pathway system 300 comprises a substrate 304 with one or more grounding points 318. The substrate 304 (see FIG. 17) may comprise one or more of, a fiberglass material 311 (see FIG. 17), a composite material 312 (see FIG. 17), a metallic material 314 (see FIG. 17), a combination 316 (see FIG. 17) of the composite material 312 (see FIG. 17) and the metallic material 314 (see FIG. 17), and other suitable materials.

The one or more grounding points 318 (see FIG. 17) may be defined grounding points that are part of a lighting protection system 356 (see FIG. 17) that is pre-existing or predetermined, or that are part of another pre-existing or predetermined electrical system 56 (see FIG. 1C), environmental system 60 (see FIG. 1C), or other system on the vehicle 26 (see FIG. 17), such as the air vehicle 26a (see FIG. 17).

The grounding points 318 (see FIG. 17) may be in the form of one or more of, one or more ground elements 319a (see FIG. 11A) with one or more ground connectors 319b (see FIG. 11A); one or more fasteners 348 (see FIG. 17); and other suitable grounding points 318 (see FIG. 17). Preferably, the grounding point 318 (see FIG. 17) is made of or contains a conductive material 336 (see FIG. 17), such as a conductive metallic material 336a (see FIG. 17), and is a conductor 364 (see FIG. 17) that effectively conducts and grounds the electric charge 302 (see FIG. 17).

The substrate 304 (see FIG. 17) may comprise a primed substrate 304a (see FIG. 17) having a primed surface 308 (see FIG. 17), if a primer layer 330 (see FIG. 17) is applied to the substrate 304 (see FIG. 17), or if the substrate 304 (see FIG. 17) undergoes a priming process 333 (see FIG. 17).

As shown in FIG. 17, the electrical conductor pathway system 300 further comprises a direct write conductive material pattern 320 printed or deposited directly onto the first surface 306a (see FIG. 11A) of the substrate 304, or surface 28 (see FIG. 17) of the structure 30 (see FIG. 17), via the direct write printing process 124 (discussed in detail above) using the direct write printing process apparatus 144 (discussed in detail above), for example, a plasma spraying process 352 using a plasma spraying apparatus 354. In particular, the direct write conductive material pattern 320 (see FIG. 17) may be applied directly to an exterior surface 309 (see FIG. 17), such as an outer mold line 310 (see FIG. 17) of the exterior surface 309 (see FIG. 17), and may be deposited or embossed on the exterior surface 309 (see FIG. 17), rather than being embedded within the interior 305 (see FIG. 11A) of the substrate 304 (see FIG. 17).

As shown in FIG. 17, the direct write conductive material pattern 320 preferably comprises a grid pattern 320a having one or more grid lines 326 with a width 327a and a height 327b. The direct write printing process 124 (see FIG. 17) preferably creates grid lines 326 (see FIG. 17) with smooth edges rather than sharp edges, that feather out along the grid lines 326 (see FIG. 17) to form one or more feathered portions 335 (see FIG. 17). As discussed above, the width 327a (see FIG. 17) and height 327b (see FIG. 17) of the grid lines 326 (see FIG. 17) may be varied depending on conductivity 366 (see FIG. 17) requirements of the first surface 306a (see FIG. 11A) of the substrate 304 (see FIG. 17), or surface 28 (see FIG. 17) of the structure 30 (see FIG. 17), and whether a flexible surface 307 (see FIG. 17) is present.

The grid pattern 320a (see FIG. 17) is preferably formed of a series of repeating geometric-shaped units 322 (see FIG. 17), such as comprising one or more of, square-shaped units 322a (see FIG. 17), hexagon-shaped units 322b (see FIG. 17), triangle-shaped units 322c (see FIG. 17), circle-shaped units 322d (see FIG. 17), and other suitable geometric-shaped units 322 (see FIG. 17).

The direct write conductive material pattern 320 (see FIG. 17), such as in the form of grid pattern 320a (see FIG. 17), is preferably made of a conductive material 336 (see FIG. 17), as discussed in detail above. The conductive material 336 (see FIG. 17) may comprise a conductive ink 168 (see FIG. 17) comprising a zirconate titanate (PZT) nanoparticle ink 104 (see FIG. 17). The conductive material 336 (see FIG. 17) may be varied to maximize conductivity 366 (see FIG. 17) or flexibility 368 (see FIG. 17).

The direct write conductive material pattern 320 (see FIG. 17) forms one or more electrical pathways 334 (see FIG. 17) interconnected with the one or more grounding points 318 (see FIG. 17). The direct write conductive material pattern 320 (see FIG. 17) has one or more locations 328 (see FIG. 17), where one or more interconnections 338 (see FIG. 17) are formed between the one or more electrical pathways 334 (see FIG. 17) and the one or more grounding points 318 (see FIG. 17).

The one or more electrical pathways 334 (see FIG. 17) interconnected with the one or more grounding points 318 (see FIG. 17) preferably divert an electric charge 302 (see FIG. 17) from a lightning strike 302a (see FIG. 17) or from precipitation static (P-static) 302b (see FIG. 17) on the exterior surface 309 (see FIG. 17) of the structure 30 (see FIG. 17), such as the air vehicle structure 350 (see FIG. 17), to the one or more grounding points 318 (see FIG. 17). The one or more electrical pathways 334 (see FIG. 17) of the electrical conductor pathway system 300 (see FIG. 17) may function as a lightning protection path 358 (see FIG. 17), and preferably provide protection against electromagnetic effects 360 (see FIG. 17) due to lightning strikes 302a (see FIG. 17).

The electrical conductor pathway system 300 preferably disperses and dissipates the electric charge 302, such as P-static 302b (see FIG. 17), thereby mitigating buildup of the P-static 302b (see FIG. 17) on the exterior surface 309 (see FIG. 17), or in a localized area, on the vehicle 26 (see FIG. 17), such as the air vehicle 26a (see FIG. 17). This dispersion and dissipation reduces the possibility of electrical discharge 370 (see FIG. 17), which may be a source of electrical noise to various communication systems onboard the air vehicle 26a (see FIG. 17) during flight. This dispersion and dissipation also reduces the possibility of personnel injuries if a person contacts the exterior surface 309 (see FIG. 17), such as a panel structure 350b (see FIG. 17), or skin, of the air vehicle 26a (see FIG. 17), after the air vehicle 26a (see FIG. 17) lands but before the air vehicle 26a (see FIG. 17) is electrically grounded.

As shown in FIG. 17, the electrical conductor pathway system 300 may further comprise a conductive coating 340 applied over the direct write conductive material pattern 320. The conductive coating 340 (see FIG. 17) preferably has conductive properties 343 (see FIG. 17), and may comprise one or more of, a conductive metal paint 340a (see FIG. 17), a conductive sealant 340b (see FIG. 17), and other suitable conductive coatings 340 (see FIG. 17).

As shown in FIG. 17, the electrical conductor pathway system 300 may further comprise a topcoat layer 344 applied over the conductive coating 340. As discussed above, the topcoat layer 344 (see FIG. 17) may function as a protective coating over all or substantially all of the conductive coating 340 (see FIG. 17) or may be applied for visual or aesthetic appearance purposes.

Figure 18:
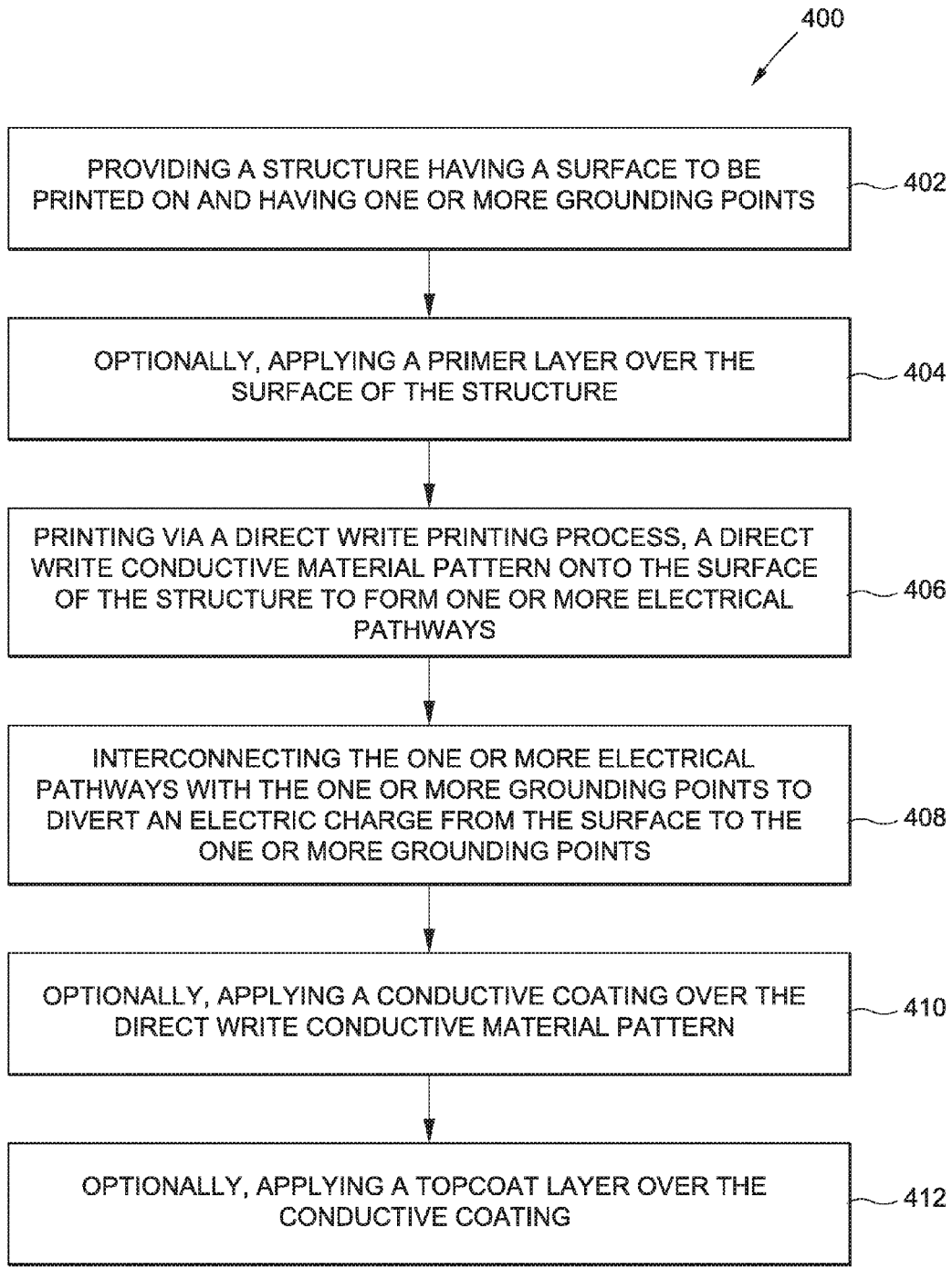

In another embodiment there is provided a method 400 (see FIG. 18) of making an electrical conductor pathway system 300 (see FIGS. 11A-15) for diverting an electric charge 302 (see FIG. 17) on a surface 28 (see FIGS. 15, 17) of a structure 30 (see FIGS. 15, 17). FIG. 18 is an illustration of a flow diagram of an embodiment of the method 400.

As shown in FIG. 18, the method (400) comprises step 402 of providing the structure 30 (see FIGS. 15, 17) having the surface 28 (see FIGS. 15, 17) to be printed on and having one or more grounding points 318 (see FIGS. 15, 17). The structure 30 (see FIGS. 15, 17) may include the substrate 304 (see FIG. 11A) having the first surface 306a (see FIG. 11A), or the primed substrate 304a (see FIG. 12A) having the primed surface 308 (see FIG. 12A), attached to the structure 30 (see FIGS. 15, 17), such as the air vehicle structure 350 (see FIG. 17). The surface 28 (see FIGS. 15, 17) may comprise a flight control surface 350a (see FIG. 17) and is preferably an exterior surface 309 (see FIG. 17), such as with an outer mold line 310 (see FIG. 17).

As shown in FIG. 18, the method 400 may further comprise step 404 of optionally, applying a primer layer 330 (see FIGS. 12A-12B, 17) over the surface 28 (see FIGS. 15, 17) of the structure 30 (see FIGS. 15, 17). As discussed above, the primer layer 330 (see FIGS. 12A-12B) may comprise an epoxy primer, such as a water reducible epoxy primer, a solvent based epoxy primer, or another suitable epoxy primer, a urethane primer, or another suitable primer.

The substrate 304 (see FIGS. 12A-12B) may also undergo, in addition to application of the primer layer 330 (see FIGS. 12A-12B), or alternatively to application of the primer layer 330 (see FIGS. 12A-12B), a priming process 333 (see FIG. 17), or surface preparation process, to prime or prepare the first surface 306a of the substrate 304 (see FIGS. 12A-12B), or the surface 28 (see FIG. 17) of the structure 30 (see FIG. 17), in order to obtain the primed substrate 304a (see FIGS. 12A-12B). For example, the priming process 333 (see FIG. 17) or surface preparation process to prime or prepare the first surface 306a (see FIGS. 12A-12B), or to prime or prepare the surface 28 (see FIG. 17), such as the exterior surface 309 (see FIGS. 11A, 17) of the structure 30 (see FIG. 17), such as an air vehicle structure 350 (see FIG. 17), may comprise cleaning with a cleaning agent or solvent, sanding or abrading, smoothing, polishing, etching, or another suitable priming process or surface preparation process.

As shown in FIG. 18, the method 400 further comprises step 406 of printing via a direct write printing process 124 (see FIG. 17), a direct write conductive material pattern 320 (see FIGS. 15, 17) onto the surface 28 (see FIGS. 15, 17) of the structure 30 (see FIGS. 15, 17) to form one or more electrical pathways 334 (see FIGS. 15, 17). The printing step 406 comprises printing the direct write conductive material pattern 320 (see FIGS. 15, 17) comprising a grid pattern 320a (see FIGS. 15, 17) made of a conductive material 336 (see FIG. 17) comprising copper, aluminum, titanium, nickel, bronze, gold, silver, or an alloy thereof, or a lead zirconate titanate (PZT) nanoparticle ink 104 (see FIG. 17), or another suitable conductive material 336 (see FIG. 17).

The printing step 406 (see FIG. 18) further comprises printing via the direct write printing process 124 (see FIGS. 10, 17) comprising one of a jetted atomized deposition process 126 (see FIG. 10), an ink jet printing process 128 (see FIG. 10), an aerosol printing process 180 (see FIG. 10), a pulsed laser evaporation process 182 (see FIG. 10), a flexography printing process 184 (see FIG. 10), a microspray printing process 186 (see FIG. 10), a flat bed silk screen printing process 187 (see FIG. 10), a rotary silk screen printing process 188 (see FIG. 10), a gravure printing process 189 (see FIG. 10), and a plasma spraying process 352 (see FIG. 17).

As shown in FIG. 18, the method 400 further comprises step 408 of interconnecting the one or more electrical pathways 334 (see FIGS. 15, 17) with the one or more grounding points 318 (see FIGS. 15, 17) to divert the electric charge 302 (see FIG. 17) from the surface 28 (see FIGS. 15, 17) to the one or more grounding points 318 (see FIGS. 15, 17).

As shown in FIG. 18, the method 400 may further comprise step 410 of optionally, applying a conductive coating 340 (see FIGS. 15, 17) over the direct write conductive material pattern 320 (see FIGS. 15, 17). As discussed above, the conductive coating 340 (see FIGS. 13A-13B) may be in the form of a conductive metal paint 340a (see FIGS. 13A-13B, 17) made of, or containing, a conductive metallic material 336a (see FIG. 17) comprising one or more of, copper, aluminum, titanium, nickel, bronze, gold, silver, an alloy thereof, and other suitable conductive metallic materials 336a (see FIG. 17). In another embodiment, the conductive coating 340 (see FIGS. 13A-13B) may be in the form a conductive sealant 340b (see FIG. 17) made of, or containing, a conductive metallic material 336a (see FIG. 17) comprising one or more of, copper, aluminum, titanium, nickel, bronze, gold, silver, an alloy thereof, and other suitable conductive metallic materials 336a (see FIG. 17). The conductive coating 340 (see FIGS. 13A-13B) provides an overall surface protection to dissipate or spread out the electric charge 302 (see FIG. 17), energy 362 (see FIG. 17) from a lightning strike 302a (see FIG. 17) or energy 362 (see FIG. 17) from precipitation static (P-static) 302b (see FIG. 17). The use of the metal loaded conductive coating 340 (see FIGS. 13A-13B) applied or deposited over the direct write conductive material pattern 320 (see FIGS. 13A, 17) preferably increases the conductivity 366 (see FIG. 17) of the electrical conductor pathway system 300 and provides a continuous conductive surface over the direct write conductive material pattern 320 (see FIGS. 13A, 17) for increased lightning protection.

As shown in FIG. 18, the method 400 may further comprise step 412 of optionally, applying a topcoat layer 344 (see FIGS. 15, 17) over the conductive coating 340 (see FIGS. 15, 17). As discussed above, the topcoat layer 344 (see FIGS. 14A-14B) may function as a protective coating over all, or substantially all, of the conductive coating 340 (see FIGS. 14A-14B), or may be applied for visual or aesthetic appearance purposes. The topcoat layer 344 (see FIGS. 14A-14B) may comprise a polyurethane paint or coating, a urethane paint or coating, an acrylic paint or coating, a combination thereof, or another suitable topcoat layer 344 (see FIG. 17). Preferably, the topcoat layer 344 (see FIGS. 14A-14B) is durable, abrasion and chemical resistant, heat resistant, and visually appealing.

Embodiments of the electrical conductor pathway system 300 (see FIGS. 11A-14B, 17) and method 400 (see FIG. 18) disclosed herein provide one or more electrical pathways 334 (see FIGS. 11A-15, 17) that are printed or deposited via a direct write printing process 124 (see FIG. 17) onto a first surface 306a (see FIG. 11A) of a substrate 304 (see FIG. 11A), or onto a surface 28 (see FIG. 17) of a structure 30 (see FIG. 17), such as an exterior surface 309 (see FIG. 17) of an air vehicle structure 350 (see FIG. 17), and that conduct electric charge 302 (see FIG. 17), or electricity, from the first surface 306a (see FIG. 11A) of the substrate 304 (see FIG. 11A), or the surface 28 (see FIG. 17) of the structure 30 (see FIG. 17), to and between one or more grounding points 318 (see FIGS. 11A-15, 17). The one or more electrical pathways 334 (see FIGS. 11A-15, 17) are preferably printed or deposited as a direct write conductive material pattern 320 (see FIGS. 11A-15, 17), in the form of a grid pattern 320a (see FIG. 11A, 17). The one or more electrical pathways 334 (see FIGS. 11A-15, 17) may be constructed of a conductive material 336, such as a conductive metallic material 336a, or of a conductive ink 168 (see FIG. 17), such as a lead zirconate titanate (PZT) nanoparticle ink 104 (see FIG. 17). The direct write conductive material pattern 320 (see FIGS. 11A-15, 17), such as a grid pattern 320a (see FIGS. 11A-15, 17), is configured to maximize conductivity 366 (see FIG. 17) and flexibility 368 (see FIG. 17). Optionally, a conductive coating 340 (see FIGS. 13A, 15, 17) may be added over the direct write conductive material pattern 320 (see FIG. 13A) to increase the conductivity 366 (see FIG. 17) and provide a continuous conductive surface over the grid pattern 320a (see FIGS. 11A-15, 17) for increased lightning protection.

The direct write conductive material pattern 320 (see FIGS. 11A-15, 17), such as a grid pattern 320a (see FIGS. 11A-15, 17), is printed or deposited directly on an exterior surface 309, such as, for example, an outer mold line 310 (see FIG. 17) of the exterior surface 309 (see FIG. 17), such as a flight control surface 350a (see FIG. 17), that may be made of a fiberglass material 311 (see FIG. 17), and does not require any special layup of the fiberglass layers. Thus, the electrical conductor pathway system 300 (see FIGS. 11A-14B, 17) does not affect the construction or design of the structure 30 (see FIG. 17), such as a composite structure 102 (see FIG. 7) or a metallic structure 132 (see FIG. 7), and decreases the chance of formation of any microcracks. The use of the direct write printing process 124 (see FIG. 17) may be applied directly to the outer mold line 310 (see FIG. 17) of the exterior surface 309 (see FIG. 17), rather than embedded within the fiberglass layers of the substrate 304 (see FIG. 11A) or the flight control surface 350a (see FIG. 17).

The electrical conductor pathway system 300 (see FIGS. 11A-14B, 17) disclosed herein does not require manufacturing with a special layup process, which may result in decreased time and expense of manufacturing. In addition, the direct write conductive material pattern 320 (see FIGS. 11A-15, 17), such as in the form of grid pattern 320a (see FIG. 11A, 17), may be printed or deposited during manufacture of the structure 30 (see FIG. 17), such as an air vehicle structure 350 (see FIG. 17), and does not require application in a less permanent, secondary operation after manufacturing.

In addition, embodiments of the electrical conductor pathway system 300 (see FIGS. 11A-14B, 17) and method 400 (see FIG. 18) disclosed herein provide protection against electromagnetic effects 360 (see FIG. 17) due to lightning strikes 302a (see FIG. 17) and divert electric charge 302 (see FIG. 17), such as from lightning strikes 302a (see FIG. 17) and P-static 302b (see FIG. 17) on the surface 28 (see FIGS. 15, 17). The direct write conductive material pattern 320 (see FIGS. 11A-15, 17), in the form of a grid pattern 320a (see FIG. 11A, 17), and the optional conductive coating 340 (see FIG. 17), may be used with the one or more grounding points 318 (see FIG. 17) to provide one or more electrical pathways 334 (see FIG. 17) to ground for the electric charge 302 (see FIG. 17) and energy 362 (see FIG. 17) from lightning strikes 302a (see FIG. 17) or P-static 302b (see FIG. 17). The electrical conductor pathway system 300 (see FIGS. 11A-14B, 17) and method 400 (see FIG. 18) disclosed herein further provide a conductive path for diversion and distribution of lightning current which, in combination with grounding points 318 (see FIG. 17), such as fasteners 348 (see FIG. 17), and other features, provides a lightning protection path 358 (see FIG. 17) and a lightning protection system 356 (see FIG. 17) for structures 30 (see FIG. 17), such as composite structures 102 (see FIG. 7) or metallic structures 132 (see FIG. 7), and provide protection of the vehicle 26 (see FIG. 17), such as the air vehicle 26a (see FIG. 17) structures 30 (see FIG. 17) and systems 50 (see FIG. 1C). The disclosed embodiments of the electrical conductor pathway system 300 (see FIGS. 11A-14B, 17) and method 400 (see FIG. 18) advantageously divert electric charge 302 (see FIG. 17) from a lightning strike 302a (see FIG. 17) or P-static 302b (see FIG. 17) to create a robust lightning protection system 356 (see FIG. 17) for a vehicle 26 (see FIG. 17), such as an air vehicle 26a (see FIG. 17).

With embodiments of the electrical conductor pathway system 300 (see FIGS. 11A-14B, 17) and method 400 (see FIG. 18) disclosed herein, if there is a direct lightning strike 302a (see FIG. 17) on the area or region of the direct write conductive material pattern 320 (see FIGS. 11A-15, 17), such as in the form of grid pattern 320a (see FIG. 11A, 17), over the one or more grounding points 318 (see FIG. 17), such as fasteners 348 (see FIG. 71), the conductor pathway system 300 (see FIGS. 11A-14B, 17) protects the underlying structure 30 (see FIG. 17) of the substrate 304 (see FIG. 17). The electrical conductor pathway system 300 (see FIGS. 11A-14B, 17) does not affect the construction of the composite material or component part it is applied to.

Moreover, embodiments of the electrical conductor pathway system 300 (see FIGS. 11A-14B, 17) and method 400 (see FIG. 18) disclosed herein provide a more producible and installable electrical conductor pathway system 300 (see FIGS. 11A-14B, 17) and lightning protection system 356 (see FIG. 17) for flexible surfaces 307 (see FIG. 17), such as flight control surfaces 350a (see FIG. 17), than known lightning strike protection systems and methods. The direct write printing process 124 (see FIG. 17) preferably achieves a very thin grid line 326 (see FIG. 17) of metallic particles of conductive material 336 (see FIG. 17), allowing the grid pattern 320a (see FIG. 17) to be printed or deposited on a flexible surface 307 (see FIG. 17). In addition, the direct write printing process 124 (see FIG. 17) results in a thin metallic deposit that adheres to the substrate 304 (see FIG. 11A), such as the flight control surface 350a (see FIG. 17) made of fiberglass, and may better handle the fatigue of a flexible surface 307 (see FIG. 17) than known lightning strike protection systems and methods, such as known embedded metallic mesh designs or metallic mesh layer overlays.

In addition, embodiments of the electrical conductor pathway system 300 (see FIGS. 11A-14B, 17) and method 400 (see FIG. 18) disclosed herein may have increased durability and repairability that may eliminate or decrease the amount of repairs that may be needed. The direct write conductive material pattern 320 (see FIGS. 11A-15, 17), such as the grid pattern 320a (see FIGS. 11A-15, 17), is discontinuous and may be more easily reapplied or repaired in situ, as compared to known lightning strike protection systems and methods, such as known appliques, which include a continuous layer applied with an adhesive and may not be easily repaired or reapplied.

Further, embodiments of the electrical conductor pathway system 300 (see FIGS. 11A-14B, 17) and method 400 (see FIG. 18) disclosed herein may be printed, deposited or applied directly to an exterior surface 309 (see FIG. 17) that requires protection, such as a flight control surface 350*a*, but is also a conductor 364 (see FIG. 17) that may achieve a high conductivity 366 (see FIG. 17) and may be patterned to achieve such high conductivity 366 (see FIG. 17). The use of a metal loaded conductive coating 340 (see FIG. 17) applied over the direct write conductive metal pattern 320 (see FIG. 17) further increases the conductivity 366 (see FIG. 17). Finally, a topcoat layer 344 (see FIG. 17) may be applied for visual appearance or additional protection.

Many modifications and other embodiments of the disclosure will come to mind to one skilled in the art to which this disclosure pertains having the benefit of the teachings presented in the foregoing descriptions and the associated drawings. The embodiments described herein are meant to be illustrative and are not intended to be limiting or exhaustive. Although specific terms are employed herein, they are used in a generic and descriptive sense only and not for purposes of limitation.

What is claimed is:

1. An electrical conductor pathway system for diverting an electric charge, the electrical conductor pathway system comprising:
   a substrate having a first surface to be printed on and having one or more grounding points; and
   a direct write conductive material pattern printed directly onto the first surface via a direct write printing process, the direct write conductive material pattern forming one or more electrical pathways interconnected with the one or more grounding points, and the direct write conductive material pattern comprising a grid pattern having repeating geometric-shaped units comprising one or more of, square-shaped units, hexagon-shaped units, triangle-shaped units, and circle-shaped units,
   wherein the one or more electrical pathways interconnected with the one or more grounding points divert the electric charge from the first surface to the one or more grounding points.

2. The system of claim 1 wherein the substrate has a primer layer applied over the first surface of the substrate to form a primed substrate having a primed surface, and the direct write conductive material pattern is printed directly onto the primed surface.

3. The system of claim 1, wherein the substrate comprises one or more of, a fiberglass material, a composite material, a metallic material, and a combination of the composite material and the metallic material.

4. The system of claim 1 further comprising a conductive coating applied over the direct write conductive material pattern.

5. The system of claim 4 wherein the conductive coating comprises one or more of, a conductive metal paint, and a conductive sealant, the conductive metal paint and the conductive sealant both having a conductive metallic material comprising one or more of, copper, aluminum, titanium, nickel, bronze, gold, silver, and an alloy thereof.

6. The system of claim 4 further comprising a topcoat layer applied over the conductive coating.

7. The system of claim 1 wherein the direct write conductive material pattern is made of a conductive material comprising one or more of, copper, aluminum, titanium, nickel, bronze, gold, silver, an alloy thereof, and a lead zirconate titanate (PZT) nanoparticle ink.

8. The system of claim 1 wherein the direct write printing process comprises one or more of, a jetted atomized deposition process, an ink jet printing process, an aerosol printing process, a pulsed laser evaporation process, a flexography printing process, a micro-spray printing process, a flat bed silk screen printing process, a rotary silk screen printing process, a gravure printing process, and a plasma spraying process.

9. The system of claim 1 wherein the grid pattern comprises one or more grid lines forming the one or more electrical pathways, the one or more grid lines each having a width of from 0.1 inch to 0.3 inch.

10. The system of claim 1 wherein the electric charge comprises one or more of, electric charge from a lightning strike, and electric charge from precipitation static (P-static).

11. An air vehicle comprising:
    an air vehicle structure having an electrical conductor pathway system, the electrical conductor pathway system comprising:
    a primed substrate having a primed surface to be printed on and having one or more grounding points;
    a direct write conductive material pattern comprising a grid pattern printed directly onto the primed surface via a direct write printing process, the direct write conductive material pattern forming one or more electrical pathways interconnected with the one or more grounding points, and the direct write conductive material pattern comprising a grid pattern having repeating geometric-shaped units comprising one or more of, square-shaped units, hexagon-shaped units, triangle-shaped units, and circle-shaped units;
    a conductive coating applied over the direct write conductive material pattern; and
    a topcoat layer applied over the conductive coating,
    wherein the one or more electrical pathways interconnected with the one or more grounding points divert an electric charge from one or more of, a lightning strike, and precipitation static (P-static) on an exterior surface of the air vehicle structure to the one or more grounding points.

12. The air vehicle of claim 11 wherein the direct write conductive material pattern is made of a conductive material comprising one or more of, copper, aluminum, titanium, nickel, bronze, gold, silver, an alloy thereof, and a lead zirconate titanate (PZT) nanoparticle ink.

13. The air vehicle of claim 11 wherein the direct write printing process comprises one or more of, a jetted atomized deposition process, an ink jet printing process, an aerosol printing process, a pulsed laser evaporation process, a flexography printing process, a micro-spray printing process, a flat bed silk screen printing process, a rotary silk screen printing process, a gravure printing process, and a plasma spraying process.

14. The air vehicle of claim 11 wherein the one or more grounding points comprise one or more of, one or more fasteners made of a conductive metallic material, and one or more ground elements and one or more ground connections, both made of the conductive metallic material.

15. A method of making an electrical conductor pathway system for diverting an electric charge on a structure, the method comprising the steps of:
    providing the structure having a surface to be printed on and having one or more grounding points;
    printing, via a direct write printing process, a direct write conductive material pattern onto the surface of the structure to form one or more electrical pathways, the direct write conductive material pattern comprising a grid pattern having repeating geometric-shaped units comprising one or more of, square-shaped units, hexagon-shaped units, triangle-shaped units, and circle-shaped units; and interconnecting the one or more electrical pathways with the one or more grounding points to divert the electric charge from the surface to the one or more grounding points.

16. The method of claim 15 further comprising prior to printing, applying a primer layer over the surface of the structure.

17. The method of claim 16 further comprising after interconnecting, applying a conductive coating over the direct write conductive material pattern.

18. The method of claim 17 further comprising after applying the conductive coating, applying a topcoat layer over the conductive coating.

19. The method of claim 15 wherein printing further comprises printing the direct write conductive material pattern comprising the grid pattern made of a conductive material comprising one or more of, copper, aluminum, titanium, nickel, bronze, gold, silver, an alloy thereof, and a lead zirconate titanate (PZT) nanoparticle ink.

20. The method of claim 15 wherein printing further comprises printing via the direct write printing process comprising one or more of, a jetted atomized deposition process, an ink jet printing process, an aerosol printing process, a pulsed laser evaporation process, a flexography printing process, a micro-spray printing process, a flat bed silk screen printing process, a rotary silk screen printing process, a gravure printing process, and a plasma spraying process.

* * * * *